United States Patent
Yuzurihara et al.

(10) Patent No.: US 11,677,385 B2
(45) Date of Patent: Jun. 13, 2023

(54) DC PULSE POWER SUPPLY DEVICE AND DUTY CONTROL METHOD FOR DC PULSE POWER SUPPLY DEVICE

(71) Applicant: KYOSAN ELECTRIC MFG. CO., LTD., Yokohama (JP)

(72) Inventors: Itsuo Yuzurihara, Yokohama (JP); Toshiyuki Adachi, Yokohama (JP); Tomohiro Yoneyama, Yokohama (JP); Koichi Miyazaki, Yokohama (JP)

(73) Assignee: KYOSAN ELECTRIC MFG. CO., LTD., Yokohama (JP)

( * ) Notice: Subject to any disclaimer, the term of this patent is extended or adjusted under 35 U.S.C. 154(b) by 0 days.

(21) Appl. No.: 17/602,049

(22) PCT Filed: Nov. 8, 2019

(86) PCT No.: PCT/JP2019/043862
§ 371 (c)(1),
(2) Date: Oct. 7, 2021

(87) PCT Pub. No.: WO2020/208852
PCT Pub. Date: Oct. 15, 2020

(65) Prior Publication Data
US 2022/0200582 A1 Jun. 23, 2022

(30) Foreign Application Priority Data
Apr. 11, 2019 (JP) .............................. JP2019-075938

(51) Int. Cl.
*H03K 3/017* (2006.01)
(52) U.S. Cl.
CPC .................................. *H03K 3/017* (2013.01)

(58) Field of Classification Search
CPC ...................................................... H03K 3/017
See application file for complete search history.

(56) References Cited

U.S. PATENT DOCUMENTS

| | | | |
|---|---|---|---|
| 7,199,502 B2 * | 4/2007 | Reggio | F02D 41/2096 310/317 |
| 2009/0051337 A1 | 2/2009 | Yoshida et al. | |

(Continued)

FOREIGN PATENT DOCUMENTS

| | | |
|---|---|---|
| EP | 2001112 A1 | 12/2008 |
| JP | 8-222258 A | 8/1996 |

(Continued)

OTHER PUBLICATIONS

International Search Report dated Jan. 28, 2020, issued in counterpart International Application No. PCT/JP2019/043862 (2 pages).

(Continued)

*Primary Examiner* — Sibin Chen
(74) *Attorney, Agent, or Firm* — WHDA, LLP

(57) ABSTRACT

In a DC pulse power supply device according to the present invention, at the time of starting pulsing operation, the duty of the pulsing operation of a chopper circuit is controlled, a switching element is set to an ON state, and the pulse width at which the DC reactor is in an energized state is made variable over the period until the capacitor voltage is charged to a sufficient voltage to reset the magnetic saturation of the DC reactor. Gradually increasing the pulse width suppresses the degree of increase in the DC reactor current, and suppresses the DC reactor current below the magnetic saturazion level. As a result, the magnetic saturation of the DC reactor is suppressed at the time of starting pulsing operation.

8 Claims, 13 Drawing Sheets

(56) References Cited

U.S. PATENT DOCUMENTS

| | | | |
|---|---|---|---|
| 2012/0262140 A1* | 10/2012 | Divan | H02M 3/156 |
| | | | 323/282 |
| 2015/0002128 A1 | 1/2015 | Cho | |
| 2018/0123440 A1 | 5/2018 | Lee et al. | |
| 2019/0165666 A1 | 5/2019 | Nishimoto et al. | |
| 2021/0296986 A1* | 9/2021 | Wu | H02M 3/157 |
| 2022/0166318 A1* | 5/2022 | Nicolosi | H02M 3/156 |
| 2022/0190719 A1* | 6/2022 | Zanchi | G01R 19/16538 |

FOREIGN PATENT DOCUMENTS

| | | |
|---|---|---|
| JP | 2004-23825 A | 1/2004 |
| JP | 2006-6053 A | 1/2006 |
| JP | 5270399 B2 | 8/2013 |
| WO | 2018/021510 A1 | 2/2018 |

OTHER PUBLICATIONS

Extended (Supplementary) European Search Report dated Mar. 29, 2023, issued in counterpart EP application No. 19924017.7. (8 pages).

Zhao et al., "High-Efficiency, High Step-Up DC-DC Converters", IEEE Transactions on Power Electronics, 2003, vol. 18, No. 1, pp. 65-73, cited in EP Extended European Search Report dated Mar. 29, 2023. (9 pages).

* cited by examiner

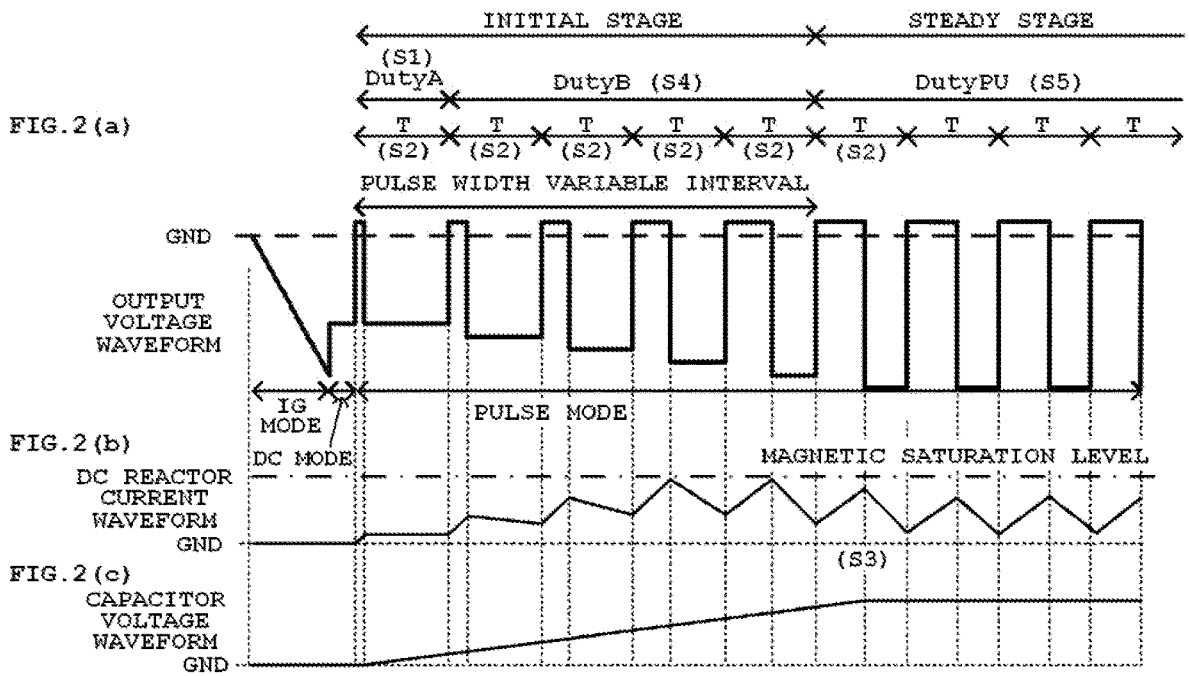
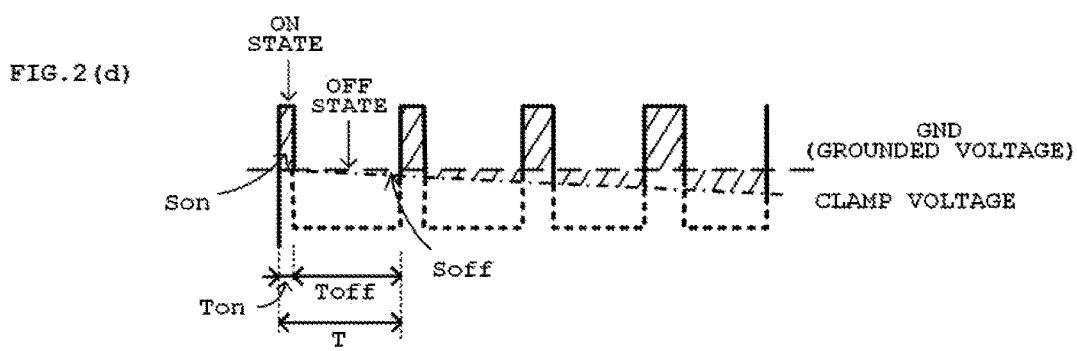

DC REACTOR CURRENT WAVEFORM DURING DUTY CONTROL

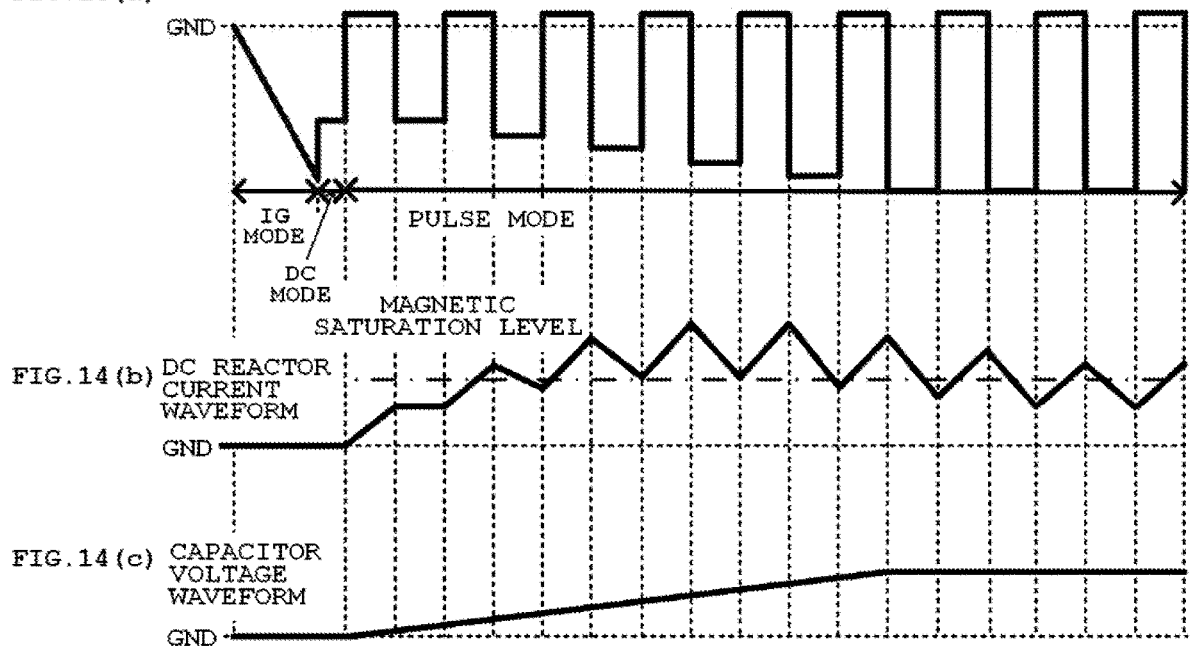
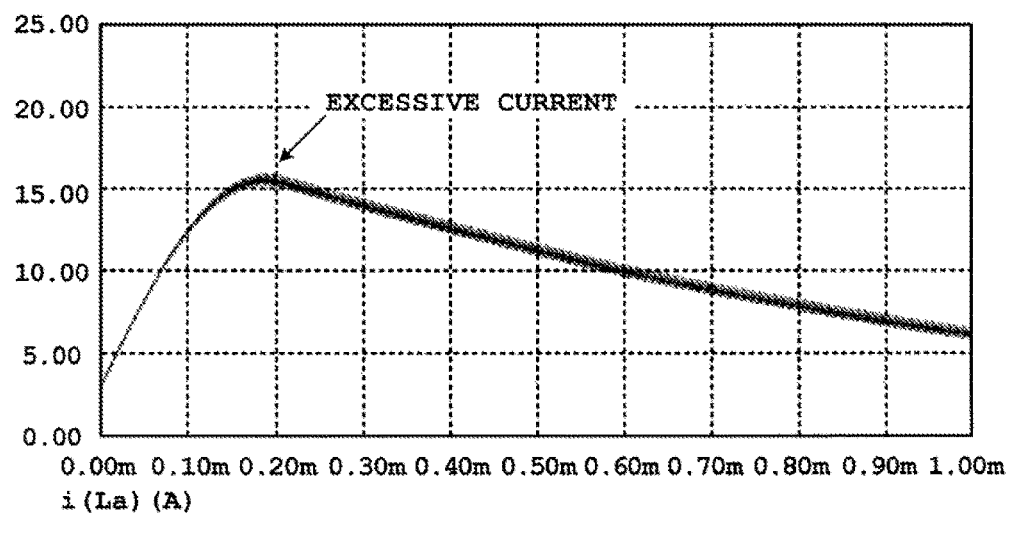
DC REACTOR CURRENT DURING MAGNETIC SATURATION

DC PULSE POWER SUPPLY DEVICE AND DUTY CONTROL METHOD FOR DC PULSE POWER SUPPLY DEVICE

TECHNICAL FIELD

The present invention relates to a DC pulse power supply device comprising a control circuit unit for preventing an occurrence of magnetic saturation, and a control method for preventing a DC reactor included in the DC pulse power supply device from reaching the magnetic saturation.

BACKGROUND ART

There is known circuitry of a DC pulse power supply device as a pulse generation circuit for generating a pulse output, comprising a series circuit composes of a DC reactor and a switching element. The pulse generation circuit repeatedly performs an ON/OFF operation of the switching element to interrupt a DC voltage, thereby obtaining a pulse output with a pulse waveform.

A pulse output from a DC pulse power supply device is a high-frequency output that continuously turns on and off a DC voltage in a range of several Hz to hundreds kHz.

The DC pulse power supply device is used for supplying the pulse output to a load of a plasma generation device, an exciting of a pulse laser, an electrical discharge machine or similar. For example, in the case of using the DC pulse power supply device as a plasma generation device, the pulse output is supplied between electrodes in a plasma generating chamber, an electrical discharge is occurred between the electrodes so as to ignite plasma and keep the generated plasma.

FIG. 11 shows a configuration example of the DC pulse power supply device, in which the DC pulse power supply device comprises a pulse generation circuit having a chopper circuit. It is known that a DC pulse power supply device uses a step-up chopper circuit as a circuit for generating a pulse waveform. A DC pulse power supply device 100 consists of a DC power supply unit 110, a pulsing unit 120 and a control circuit unit 140. A step-up copper circuit of the pulsing unit 120 is composed of a DC reactor 121 and a switching element 122 connected in series, in which the switching element 122 performs an ON/OFF operation in response to a drive signal from a drive circuit 123 which is controlled by the control circuit unit 140, thereby supplying a pulse output obtained by boosting a DC voltage in the DC power supply unit 110 to a load 150 (see Patent Literatures 1 and 2).

CITATION LIST

Patent Literature

[Patent Literature 1] Japanese Patent Laid-Open Publication No. 222258/1996 (FIG. 1, Paragraph 0012)
[Patent Literature 2] Japanese Patent Laid-Open Publication No. 2006-6053 (FIG. 1)

SUMMARY OF THE INVENTION

Problems to be Solved by the Invention

In the case of using the DC pulse power supply device as a plasma generation device, a pulse output of the DC pulse power supply device is supplied between electrodes in a chamber of the plasma generation device, and ignites plasma by an electrical discharge occurring between the electrodes, thereby maintaining the generated plasma. When the plasma is used as load, the DC pulse power supply device supplies the pulse output to a plasma load by processing in an ignition mode, a DC mode and a pulse mode. The ignition mode ignites the plasma, the DC mode in turn maintains a certain discharge voltage state, and then the pulse mode activates a pulsing operation.

FIG. 12 is a schematic flowchart illustrating each mode allowing the DC pulse power supply device to supply the pulse output to the plasma load.

The plasma generation device typically corresponds to an electrical load for the DC pulse power supply device, and there is a difference in impedance states between a load at the start of plasma discharge until the plasma discharge occurs and a load during a normal operation in which the plasma discharge occurs stably. Thus, in general, the DC power supply device gradually boosts a voltage to develop the plasma discharge, thereby applying a voltage greater than a voltage in the normal operation to the electrodes over a predetermined period. The mode that performs the above output is called as ignition mode (S10).

The occurrence of the plasma discharge by the ignition mode leads to the certain discharge voltage state. This mode for the above output is called as DC mode (S20).

After the DC mode, a DC voltage is turned ON/OFF with a predetermined duty to bring a pulse output state. This mode that performs the above output is called as pulse mode (S30).

In a chopper circuit of a pulsing unit 120A shown in FIG. 13(a), in a DS voltage between a drain D and a source S of the switching element 122A, a surge voltage is generated by a leakage inductance included in a DC reactor 121A during an OFF state of the switching element 122A. The inventors of the present application suggest a configuration for preventing the switching element 122A from being damaged by the surge voltage, in which configuration a voltage clamping unit 130B is provided to clamp a voltage across a DC reactor 121B to a predetermined voltage. FIG. 13(b) shows a schematic view of suggested circuitry. The voltage clamping unit 130B has a capacitor C connected in parallel to the DC reactor 121B. The voltage clamping unit 130B clamps a voltage VC of the capacitor C to a voltage lower than the surge voltage to thereby suppress an excessive rise in the DS voltage.

In general, permeability of a reactor decreases as a magnetic field increases due to an increase in a reactor current, and when a magnetic flux density of a magnetic material reaches its peak, the reactor reaches a magnetic saturation state. IN the magnetic saturation state, the permeability decreases. Low permeability of the reactor causes overcurrent. The magnetic saturation of the reactor is reset when a voltage with a polarity different to that of the reactor is applied to the reactor and a voltage-time product (ET product), which is a product of applied voltage and time, is equal to the reverse polarity.

In FIG. 13(c), a voltage-time product Son in an ON period of a switching element 122B is equalized to a voltage-time product Soff in an off period in magnitude with opposite polarity, so that the magnetic saturation of the DC reactor 121B is reset.

FIGS. 14(a) to 14(c) illustrate the magnetic saturation state of the DC reactor, in which FIG. 14(a) shows a waveform of an output voltage of the DC power supply device, FIG. 14(b) shows a waveform of a saturation current of a DC reactor current iDCL, and FIG. 14(c) shows a waveform of a voltage of the capacitor C.

The circuitry including a voltage clamping unit has a drawback that the magnetic saturation of the DC reactor cannot be reset adequately. FIG. 13(c) shows a status of occurrence of the magnetic saturation. A voltage Voff in the OFF period Toff of the switching element 122B serves as reset voltage, and gradually increases during activation by pulse generation. However, the voltage Voff is clamped to a capacitor voltage VC in the capacitor C of a voltage clamping unit 130B, so that the increase in a reset voltage is not sufficient for resetting the magnetic saturation in the initial stage. Consequently, in the pulse mode in the initial stage during activation by the pulse generation, the voltage-time product Soff in the off period of the switching element 122B is smaller than the voltage-time product Son in the ON period Ton of the switching element 122B, and thus the magnetic deviation of the DC reactor is not reset, and that leads to the magnetic saturation.

When the DC reactor 121 reaches the magnetic saturation, an inductance decreases, and thereby an excessive current flows. FIG. 15 shows an example of a current in the DC reactor that presents a state where the excessive current is generated due to the magnetic saturation. Thus, in the pulse mode in the initial stage during activation by the pulse generation, since the degree of the reset voltage for resetting the magnetic saturation is not sufficient, a problem arises that the excessive current is generated due to the magnetic saturation.

It is an object of the present invention to solve the above-described problems, and prevent the occurrence of the magnetic saturation of the DC reactor during the activation by the pulse generation and prevent the generation of the excessive current due to the magnetic saturation in the DC pulse power supply device.

More specifically, it is an object of the invention to suppress the DC reactor current to prevent the occurrence of the magnetic saturation during the activation by the pulse generation until the capacitor voltage of the capacitor connected in parallel to the DC reactor reaches the voltage sufficient for resetting magnetic saturation.

Means for Solving the Problem

In order to prevent the rise in the surge voltage generated by the leakage inductance of the DC reactor in the chopper circuit included in the pulsing unit, the DC pulse power supply device of the invention has a voltage clamping unit including a capacitor connected in parallel to the DC reactor. In the DC pulse power supply device, a reactor voltage during when the switching element of the chopper circuit is in the OFF state is suppressed by the voltage clamping unit, leading to the occurrence of the magnetic saturation of the DC reactor. A control circuit unit of the DC pulse power supply device of the invention controls a duty of the operation of the switching element, so as to reset the magnetic saturation of the DC reactor and prevent the occurrence of the magnetic saturation.

The DC pulse power supply device of the present invention controls the duty of the pulsing operation of the chopper circuit during the activation of the pulsing operation which is the initial stage of the pulse mode until the capacitor voltage is charged enough to reset the magnetic saturation of the DC reactor, thereby making a pulse width variable that brings the switching element into the ON state to pass a current through the DC reactor. The duty or pulse width is gradually increased to gradually increase a voltage-time product in the ON state of the switching element. The gradual increase in the duty and the pulse width prevents the increase in a difference between the voltage-time product in the ON state of the switching element and a voltage time product in the OFF state of the switching element even when the clamp voltage is suppressed by the OFF operation of the switching element, thereby preventing the magnetic saturation of the DC reactor.

In this context, the gradual increase means that a value is increased little by little from its initial value to a predetermined value. As to the duty or pulse width, the predetermined value reached by gradual increase is a duty or pulse width that makes the capacitor voltage to reach the degree adequate for resetting the magnetic saturation of the DC reactor due to the ON state of the switching element. The initial value does not cause the magnetic saturation of the reactor, and is set to a value sufficiently smaller than the predetermined value.

After the pulsing operation is activated, the capacitor voltage increases in the initial stage, so that the stage moves to a steady stage. In the steady stage, a voltage to be applied to the DC reactor is suppressed to the clamp voltage of the capacitor voltage. However, the capacitor voltage is set to the value adequate for resetting the magnetic saturation of the DC reactor, so that the magnetic saturation of the DC reactor is prevented in the pulse mode in which the duty is changed for the steady stage.

The present invention has embodiments of a DC pulse power supply device and a duty control method for the DC pulse power supply device.

DC Pulse Power Supply Device

The DC pulse power supply device of the present invention comprises a DC power supply, a pulsing unit connected to the DC power supply and generates a pulse output by using a step-up chopper circuit comprising a series circuit composed of a DC reactor and a switching element, a voltage clamping unit that includes a capacitor connected in parallel to the DC reactor of the pulsing unit and limits a voltage across the DC reactor to a clamp voltage by a capacitor voltage in the capacitor, and a control circuit unit for controlling a switching operation of the switching element of the pulsing unit.

The control circuit unit comprises a pulse mode control unit that controls the pulsing operation in the pulse mode for generating a pulse output in a certain cycle. The pulsing operation in the pulse mode is for repeating an ON/OFF operation of the switching element in the certain cycle with a prescribed duty ratio, so as to supply electric power according to the duty ratio by the pulse output from the DC power supply to a load.

The pulse mode control unit of the invention comprises a duty control unit that makes a pulse width variable, and performs the duty control in two stages, namely an initial stage and a steady stage. The duty control unit gradually increases the pulse width for closing and turning the switching element into an ON state in the initial stage of the pulsing operation, thereby gradually increasing the length of a period for flowing a reactor current through the DC reactor. In the initial stage, a voltage-time product in an OFF state of the switching element is small because the voltage of the DC reactor is clamped. If the pulsing operation is repeated with the pulse width in the ON state of the switching element kept at the steady state, a difference in the voltage-time products increases that leads to magnetic saturation.

The duty control of the invention gradually increase the pulse width, which closes and turns the switching element into the ON state in the initial stage, from its initial value to a pulse width with the duty in the steady stage, so as to limit the voltage-time product in the ON state of the switching element in the initial stage, hold down the increase in the difference from the voltage-time product in the OFF state of the switching element, and prevent the occurrence of the magnetic saturation in the initial stage.

In the steady stage, the ON/OFF operation of the switching element is performed in the pulse width with a steady duty in the pulse mode to thereby supply steady electric power to the load. In the steady stage, the capacitor voltage is at the degree adequate for resetting the magnetic saturation of the DC reactor, so that the DC reactor does not reach the magnetic saturation in the pulse mode in which the duty is changed to the steady stage even if the voltage is clamped to the capacitor voltage.

In order to prevent the DC reactor from reaching the magnetic saturation, the duty control of the invention controls the duty for preventing the occurrence of the magnetic saturation of the DC reactor in the initial stage, and then controls the duty in the steady stage after the capacitor voltage is charged enough to reset the magnetic saturation.

The duty control of the invention controls the duty by defining a frequency of the pulsing operation to a constant frequency. In the pulsing operation at the constant frequency, since a time width in one cycle of the pulsing operation is constant, making the duty variable corresponds to making the pulse width variable. Thus, the gradual increase in the duty in the duty control of the invention can prevent the occurrence of the magnetic saturation of the DC reactor in the initial stage during which the capacitor voltage does not reach the degree adequate for resetting the magnetic saturation.

In the initial stage of the pulsing operation, as the capacitor voltage is not charged to a reset voltage that resets the magnetic saturation of the DC reactor, it is difficult to reset the magnetic saturation of the DC reactor by the capacitor voltage.

The present invention controls the duty of the pulsing operation of the chopper circuit in the initial stage for activating the pulsing operation to bring the switching element into the ON state until the capacitor voltage is charged enough to reset the magnetic saturation of the DC reactor, thereby gradually increasing the pulse width of the DC reactor current flowing through the DC reactor. Although the DC reactor is in the state of passing a current when the switching element is in either of the ON state or OFF state, the DC reactor current flowing through the DC reactor in the ON state is larger than the current flowing through the DC reactor in the OFF state. Thus, the current in the DC reactor is increased during a period corresponding to the pulse width, so as to facilitate charge of the capacitor. The present invention gradually increases the pulse width from its initial value to a predetermined value, thereby preventing the occurrence of the magnetic saturation in the initial stage while boosting the capacitor voltage.

The duty control unit of the invention has, in the pulse mode, a start duty value in the initial stage, a transition duty value that the duty gradually increases, and a steady duty value in the steady stage, and uses these duty values to perform the pulsing operation in the respective cycles.

At the start of the pulsing operation, a value of a duty or a pulse width based on the start duty value is used to start the pulsing operation. After the start of the pulsing operation, tha value is changed from the start duty value to the transition duty value to implement the pulsing operation with a duty or pulse width based on the gradually-increasing transition duty value. After the capacitor voltage reaches the degree adequate for resetting the magnetic saturation, the value is changed from the transition duty value to the steady duty value of the pulse mode. In order to determine whether or not the capacitor voltage has reached the degree adequate for resetting the magnetic saturation, a detection can be made on the basis of a voltage value or a voltage change of the capacitor voltage in the capacitor. The transition duty value is gradually increased by increasing the duty in every cycle. The range of increase in the duty can be defined according to the drive conditions, such as a frequency from the start duty value to steady duty value.

The pulse mode control unit comprises a voltage evaluating unit that evaluates whether or not the capacitor voltage has reached a charging voltage. The duty control unit changes a duty value from the transition duty value to the steady duty value in the pulse mode based on a result of the evaluation of the voltage value or voltage change of the capacitor voltage made by the voltage evaluating unit. When a comparison result between the capacitor voltage and a set voltage shows that the capacitor voltage exceeds the set voltage or when a comparison result between a voltage change $\Delta VC$ in the capacitor voltage and a set value shows that the voltage change $\Delta VC$ is within the set value, the voltage evaluating unit evaluates that the capacitor has been charged and the capacitor voltage has reached the degree adequate for resetting the magnetic saturation of the DC reactor. For the set voltage, a preset charging completion voltage may be used, by way of example.

The DC pulse power supply device of the invention comprises a regeneration unit that regenerates a component of a reactor voltage of the DC reactor that exceeds the set voltage to the DC power supply. The regeneration unit is configured to have a capacitor connected in parallel to the DC reactor, the capacitor serves as a voltage clamping unit for applying a clamp voltage for suppressing a surge voltage to the DC reactor and as the regeneration unit for regenerating a reset voltage.

Duty Control Method for DC Pulse Power Supply Device

A duty control method of the present invention is for controlling a DC pulse power supply device that comprises a DC power supply, a pulsing unit that is connected to the DC power supply and generates a pulse output by using a step-up chopper circuit comprising a series circuit composed of a DC reactor and a switching element, a voltage clamping unit that includes a capacitor connected in parallel to the DC reactor of the pulsing unit and limits a voltage across the DC reactor to a clamp voltage by a capacitor voltage in the capacitor, and a control circuit unit that controls a switching operation of the switching element, of the pulsing unit, and the method controls a duty of the switching operation until the capacitor voltage reaches the degree adequate for resetting magnetic saturation of the DC reactor, thereby resetting the magnetic saturation of the DC reactor.

The control circuit unit controls a time cycle for performing an ON/OFF operation of the switching element by a pulse mode control unit which controls a pulsing operation in a pulse mode for generating a pulse output in a certain cycle, and performs duty control for varying a pulse width at an interval where a DC reactor current increases.

The duty control is performed, (a) in an initial stage of the pulsing operation, to gradually increase the pulse width from an initial value at the start of the pulsing operation to a steady value in a steady stage, and (b) in the steady stage of the pulsing operation performed after the initial stage, to hold the pulse width to the steady value of a predetermined set width.

In the initial stage of the pulsing operation, the capacitor voltage is charged in the process of gradually increasing the pulse width from the initial value to the steady value, and after the capacitor voltage is charged to a sufficient degree, the capacitor voltage stops to rise to be a constant voltage. This capacitor voltage is set to a voltage adequate for resetting the magnetic saturation of the DC reactor, thereby resetting the magnetic saturation of the DC reactor.

The present invention uses this capacitor voltage as a specified voltage. The specified voltage is the capacitor voltage that is adequate for constantly resetting the magnetic saturation of the capacitor in the pulse mode, and functions as a voltage for defining a point to change the duty into the steady duty. It is possible to detect whether or not the capacitor voltage has reached the specified voltage based on a voltage value or voltage change of the capacitor voltage, and thus a determination is made on whether or not the capacitor voltage has reached the specified voltage by detecting that the voltage value of the capacitor voltage has reached a specified voltage value or that the voltage change of the capacitor voltage has stopped. The specified voltage value can be defined by obtaining beforehand the voltage value of the capacitor voltage when the capacitor voltage is charged enough to reset the magnetic saturation.

After the capacitor voltage has been charged up to the specified voltage, power supply limitation by the duty control is resolved, and thereby the pulse width is held to a steady value of a predetermined width to supply a certain amount of electric power to a load. When plasma is used as the load, a pulse output is created by the pulse width based on a predetermined duty in the pulse mode, so as to supply the pulse output to a plasma load to maintain plasma discharge.

Effects of the Invention

As described above, according to the present invention, the DC pulse power supply device can prevent the magnetic saturation of the DC reactor caused by the pulsing operation to thereby prevent the generation of an excessive current due to the magnetic saturation.

Furthermore, during the pulsing operation, the DC pulse power supply device prevents the magnetic saturation by performing the duty control to limit the amount of electric power to be supplied to the load in the initial stage until the capacitor voltage in the capacitor connected in parallel to the DC reactor reaches the degree adequate for resetting the magnetic saturation, and performs the duty control to stop the power supply in the steady stage during which the capacitor voltage reaches the degree adequate for resetting the magnetic saturation so as to perform the power supply with the steady duty value of the pulse mode.

BRIEF DESCRIPTION OF THE DRAWINGS

FIGS. 2(a) to 2(d) are a waveform chart illustrating states of a voltage and a current in the duty control of the DC pulse power supply device of the invention;

FIGS. 14(a) to 14(c) illustrate a state of the magnetic saturation of the DC reactor; and FIG. 15 illustrates an example of a current in the DC reactor.

BEST MODE FOR CARRYING OUT THE INVENTION

Figure 1:
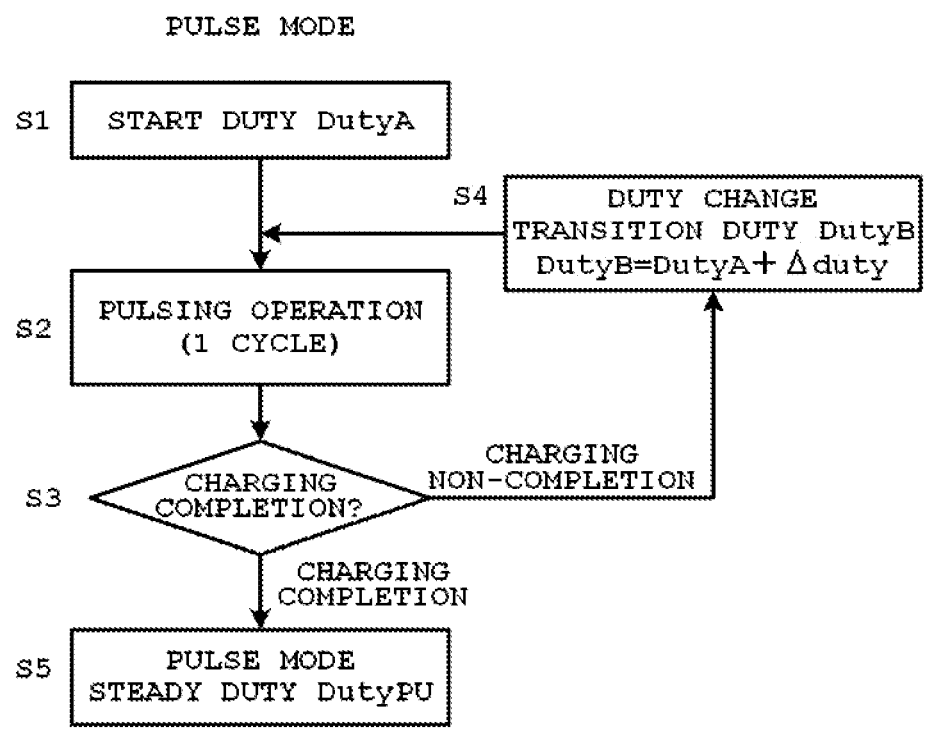
FIG. 1 is a flowchart illustrating duty control of a DC pulse power supply device of the invention.

The DC pulse power supply device of the invention comprises a pulsing unit that has a chopper circuit for generating a pulse output from a DC voltage, and also comprises a voltage clamping unit having a capacitor connected in parallel to the DC reactor of the chopper circuit in order to prevent the rise in a surge voltage generated by a leakage inductance of the DC reactor of the chopper circuit. The voltage clamping unit clamps a voltage across the DC reactor to a capacitor voltage to thereby prevent the rise in the surge voltage.

On the other hand, as a reactor voltage in an OFF state of a switching element of the chopper circuit is suppressed by the voltage clamping unit in the DC pulse power supply device, a voltage-time product is not sufficient for resetting magnetic saturation, causing the DC reactor to reach the magnetic saturation.

The DC pulse power supply device of the invention also comprises a control circuit unit that controls a duty of an operation of the switching element, such that the voltage-time product in the OFF state of the switching element is sufficient for resetting the magnetic saturation, and thereby a reset voltage is clamped to prevent the occurrence of the magnetic saturation.

The DC pulse power supply device of the present invention adjusts a duty or a pulse width of a pulsing operation of the chopper circuit at the time of activating the pulsing operation, which is an initial stage of a pulse mode, until the capacitor voltage is charged enough to reset the magnetic saturation of the DC reactor, thereby bringing the switching element into an ON state to make the pulse width variable for flowing a DC reactor current larger than a current in the OFF state. The duty or pulse width is gradually increased to gradually increase a voltage-time product in the ON state of the switching element.

Even when the clamp voltage is suppressed by the OFF operation of the switching element, the duty and the pulse width are gradually increased to prevent the occurrence of the magnetic saturation of the DC reactor due to the less voltage-time product in the OFF state of the switching element than the voltage-time product in the ON state of the switching element by relatively increasing the length of a time width of the OFF state.

In this context, the gradual increase means that a value is increased little by little from an initial value to a predetermined value. A steady value obtained by the gradual increase is a duty or pulse width that allows the capacitor voltage to be sufficient for resetting the magnetic saturation of the DC reactor in the ON state of the switching element. The initial value is sufficiently smaller than the steady value.

In the pulse mode, the pulsing operation includes an initial stage during the activation and a steady stage after the activation. In the initial stage, the capacitor voltage is increased to reach a degree adequate for the reset, and then the stage goes into the steady stage. In the steady stage, a clamp voltage of the capacitor voltage reaches the degree adequate for resetting the magnetic saturation of the DC reactor. Although, the voltage applied to the DC reactor is clamped to the clamp voltage of the capacitor voltage in the steady stage, the degree of the capacitor voltage is adequate for resetting the magnetic saturation of the DC reactor, so that the DC reactor does not reach the magnetic saturation in the pulse mode in which the duty is changed into a steady duty in the steady stage.

Now, the duty control of the DC pulse power supply device of the invention will be described by referring to FIGS. 1 to 3, and a schematic configuration of the DC pulse power supply of the invention will be described by referring to FIG. 4. In addition, configuration examples of the DC pulse power supply of the invention will be described by referring to FIGS. 5 to 10.

(Duty Control)

FIG. 1 is a flowchart that illustrates the duty control of the DC pulse power supply device of the present invention, showing the duty control in the pulse mode. FIGS. 2(*a*) to 2(*d*) show waveforms of an output voltage by the duty control (FIG. 2(*a*)), the DC reactor current (FIG. 2(*b*)), and the capacitor voltage (FIG. 2(*c*)). Moreover, FIG. 2(*d*) shows a state in which the occurrence of the magnetic saturation is prevented in the initial stage of the pulse mode.

The DC pulse power supply device performs, in the case of using plasma as a load, the pulsing operation in an ignition mode, a DC mode and the pulse mode to thereby supply electric power to the plasma load. The pulsing operation firstly ignites the plasma in the ignition mode, and after undergoing given constant discharge voltage state in the DC mode, sends a pulse output generated in the pulse mode to the load. In the pulse mode, the pulse output generated by performing an ON/OFF operation on a DC voltage with a predetermined duty is supplied to the load to maintain plasma discharge.

FIGS. 2(*a*) to 2(*d*) indicate the ignition mode with an IG mode, and the DC mode with a DC mode. In the output voltage waveform shown in FIG. 2(*a*), the output voltage increases from a grounded level (GND level) in a linear manner in the ignition mode. After ignition of the plasma, the mode is changed from the ignition mode to the DC mode, and after a certain level of the DC voltage is applied in the DC mode, changed to the pulse mode to thereby generate the pulse output.

The duty control of the invention generates the pulse output in the pulse mode by changing a value of the duty between a start duty value (DutyA), a transition duty value (DutyB) and a steady duty value (DutyPU) in the pulse mode.

The duty control of the present invention controls the pulse mode in two stages, i.e. initial stage and steady stage.

The initial stage is a period during which a capacitor voltage VC forming the clamp voltage is charged starting from 0V to a degree adequate for resetting the magnetic saturation in the steady duty. In the initial stage, the capacitor voltage VC is in a state inadequate for resetting the magnetic saturation of the DC reactor. Consequently, when the actuation is performed with the steady duty value in a steady state, the DC reactor reaches the magnetic saturation that may generate an excessive current. In order to prevent the occurrence of the magnetic saturation, the duty is gradually increased in the initial stage to increase the duty value little by little from the start duty value (DutyA) to the steady duty value (DutyB).

The steady stage is a period for generating the pulse output in the steady state, during which the pulse output is generated from the DC voltage in the duty with the steady duty value (DutyPU). In the steady stage, the capacitor voltage VC is charged enough to reset the magnetic saturation, so that the magnetic saturation of the DC reactor can be reset even when the ON/OFF operation of the switching element is performed with the steady duty value (DutyPU). The initial stage and the steady stage of the pulse mode will be described below.

Initial Stage of Pulse Mode

The initial stage in the pulse mode proceeds from the start to a transition period, and then the stage moves to the steady stage.

Start of Pulse Mode

At the start of the pulse mode, a DC reactor current iDCL is zero (FIG. 2(*b*)), and the capacitor voltage VC is at the grounded voltage level (GND) (FIG. 2(*c*)). The capacitor voltage VC is used as a voltage for resetting the magnetic saturation of the DC reactor, but is at the grounded voltage level (GND) at the start of the pulse mode, so that the capacitor voltage VC is not adequate for resetting the magnetic saturation of the DC reactor.

When the pulsing operation is performed with the steady duty value (DutyPU) in the steady stage of the pulse mode from the start of the pulse mode, the ON/OFF operation according to the steady duty value (DutyPU) is repeated several times, and thereby the DC reactor current in a state according to a pulse width flows through the DC reactor.

Since the steady duty value (DutyPU) is set to be able to obtain enough electric power to supply the power required to maintain the plasma state, the repetitive supply of the pulse output in the state where the voltage is not enough to reset the magnetic saturation causes the occurrence of the magnetic saturation of the DC reactor.

In the duty control of the invention, the pulsing operation starts with the start duty value (DutyA) having a pulse width shorter than the pulse width of the steady duty value (DutyPU) in a first cycie at the start (S1). In the pulsing operation in the first cycle at the start, the DC reactor current iDCL and the capacitor voltage VC increase in the pulse width during which the switching element, is in the ON state (FIGS. 2(*b*), 2(*c*)). Since the capacitor voltage VC increases from 0V, it is not adequate for resetting the magnetic saturation.

Transition Period of Duty

Since the capacitor voltage VC is not adequate for resetting the magnetic saturation at the start of the pulse mode, the capacitor voltage VC is further boosted in the subsequent transition period.

After the pulsing operation in the first cycle at the start of the pulse mode is performed (S2), a determination is made on whether or not the capacitor voltage VC has reached the degree adequate for resetting the magnetic saturation. This determination can be performed by detecting a voltage value of the capacitor voltage VC or voltage change ΔVC in the capacitor voltage VC. At the stage where the capacitor voltage VC has been charged and reached the degree adequate for resetting the magnetic saturation, the capacitor voltage VC becomes a charging completion voltage at a predetermined level, and thus the voltage change ΔVC will not occur any more. In this connection, the charging completion voltage of the capacitor voltage VC serves as a set voltage defined according to the voltage sufficient for resetting the magnetic saturation.

When a comparison between the capacitor voltage VC and the set voltage results in the capacitor voltage VC having reached the set voltage, or when a comparison between the voltage change ΔVC of the capacitor voltage VC and a set value results in the voltage change ΔVC having decreased to fall within the set value, it is determined that the charge of the capacitor has been completed and the capacitor voltage has been reached the degree adequate for resetting the magnetic saturation of the DC reactor. For the set voltage and the set value, a charging completion voltage of a capacitor provided to the voltage clamping unit and a voltage fluctuation width at the time of the completion of the charge of the capacitor can be employed.

In the case where the capacitor does not reach the charging completion state and the capacitor voltage VC does not reach the set voltage, or in the case where the voltage change ΔVC exceeds the set value, the start duty value (DutyA) is replaced by the transition duty value (DutyB) in the transition period subsequent to the start period to increase the duty. The transition duty value (DutyB) in the transition period can be defined by adding a value ΔDuty to the duty in the previous cycle, for instance. The transition duty value (DutyB) in the first cycle of the transition period can be defined by adding the value ΔDuty to the start duty value (DutyA), and from the next cycle of the transition period, defined by adding the value ΔDuty to the previous transition duty value (DutyB). The added value ΔDuty is a transition width of the duty that can be defined, for example, by an expression of (DutyPU−DutyA)/N based on the number N of cycles in an interval where the pulse width changes in the initial stage, the start duty value (DutyA) and the steady duty value (DutyPU).

The increased amount of the added value ΔDuty is an example and can be set arbitrarily within the criteria of the number N of cycles, start duty value (DutyA) and the steady duty value (DutyPU).

In the duty transition period, the capacitor voltage VC is boosted to the charging completion voltage by the pulsing operation in each cycle. By contrast, although the DC reactor current iDCL is gradually increased due to the increase in the interval where the switching element is in the ON state and the decrease in the interval where the switching element is in the OFF state, the voltage-time product is increased in the OFF state by the increase in the capacitor voltage VC, so that the magnetic saturation is reset and thus the upper limit of the DC reactor current iDCL is restricted to be equal to or lower than the magnetic saturation level.

In the last cycle in the duty transition period, the capacitor voltage VC is charged to the degree adequate for resetting the magnetic saturation of the DC reactor. In the procedure of S3, when the charging completion state of the capacitor voltage VC is detected, the value of the duty is changed from the transition duty value (DutyB) to the steady duty value (DutyPU) to generate the pulse output by the pulsing operation with the steady duty value (DutyPU) (S5).

FIG. 2(d) shows the state of the voltage-time product in the initial stage of the pulse mode. In the initial stage of the pulse mode, a voltage corresponding to an ON-resist voltage of the switching element is applied in a period (Ton) during which the switching element is in the ON state, whereas the clamp voltage is applied to the voltage across the DC reactor in a period (Toff) during which the switching element is in the OFF state. The clamp voltage is the capacitor voltage that is a charging voltage of the capacitor, and is gradually boosted from 0V in the initial stage. In the beginning of the initial stage, a voltage-time product Soff in the OFF period (Toff) of the switching element is smaller than a voltage-time product Son in the ON period (Ton) of the switching element and the DC reactor is in a magnetically deviated state, and then as the clamp voltage is gradually boosted, a difference between the voltage-time product Soff and the voltage-time product Son is reduced to thereby enable to reset the magnetic saturation.

Steady Stage of Pulse Mode

In the steady stage of the pulse mode, the pulsing operation is performed in the duty with the steady duty value (DutyPU). In the steady stage, the capacitor voltage VC is charged to the degree adequate for resetting the magnetic saturation of the DC reactor, so that the DC reactor is reset without reaching the magnetic saturation, and the DC reactor current iDCL is varied by increasing or decreasing it in each cycle but does not exceed the magnetic saturation level.

Figure 3:
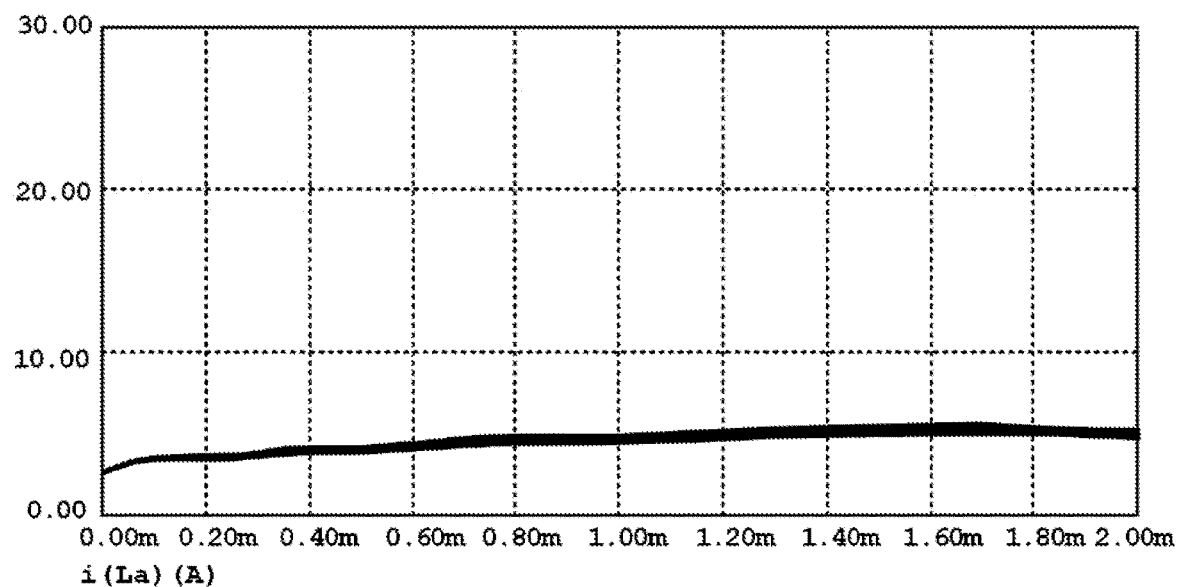
FIG. 3 is a current waveform chart of a DC reactor current during the duty control of the invention.

FIG. 3 shows a current waveform of the DC reactor current obtained by the duty control according to the present invention. The illustrative current waveform shows that the DC reactor current does not become an excessive current in either of the ignition mode, the DC mode, or the initial stage or the steady stage of the pulse mode.

Schematic Configuration of DC Pulse Power Supply Device

Figure 4:
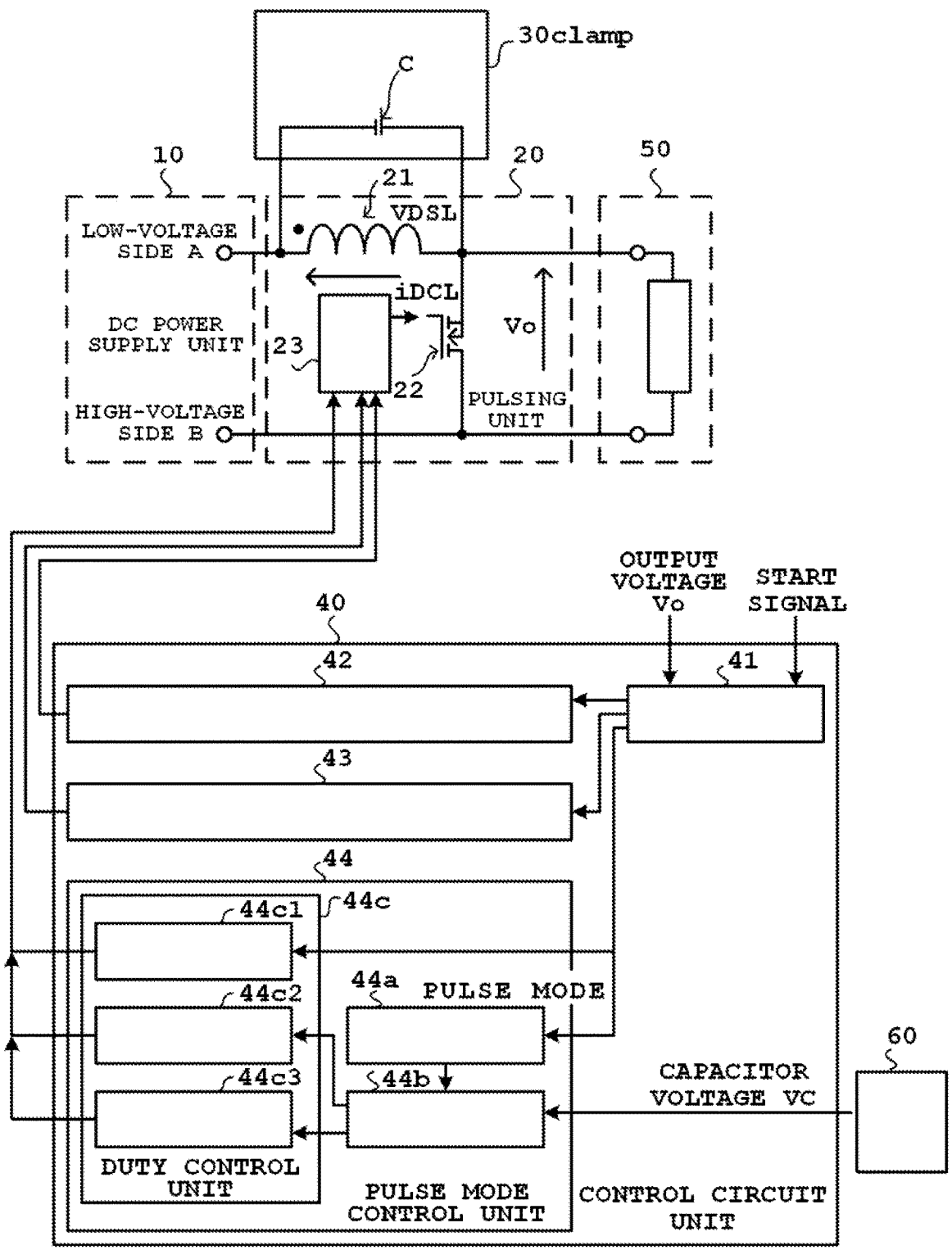
FIG. 4 illustrates a schematic configuration of a magnetic saturation resetting unit of the invention.

FIG. 4 shows a configuration example of the DC pulse power supply device of the present invention. The DC pulse power supply device comprises a DC power supply unit 10, a pulsing unit 20, a control circuit unit 40 and a voltage detecting unit 60, the pulsing unit 20 supplying a pulse output produced from a DC voltage in the DC power supply unit 10 to a load 50.

The pulsing unit 20 can be composed of a step-up chopper circuit. In FIG. 4, the pulsing unit 20 comprises a step-up chopper circuit configured by connecting in series the DC reactor 21 and the switching element 22. The DC reactor 21 is connected in series between the DC power supply unit 10 and a load 50, and the switching element 22 is connected in parallel with respect to the load 50 side. The drive circuit 23 performs the ON/OFF operation of the switching element 22 to convert a DC voltage to generate a pulse output with a pulse waveform. Furthermore, to the DC reactor 21, the capacitor C of the voltage clamping unit 30 clamp is connected in parallel.

In the illustrative configuration example, the pulsing unit 20 is provided on the DC power supply side with a terminal B which is grounded on a high-voltage side and a terminal A for a negative voltage as low-voltage side. In the figure, the switching element 22 is an example of FET, in which a source S is connected to the terminal A on the low-voltage side and a drain D is connected to the terminal B on a high-voltage side of a grounded voltage, and a drive signal from the drive circuit 23 is input to a gate G.

The control circuit unit 40 produces a control signal that defines a time width or duty ratio between an ON time and an OFF time of the switching element 22 which corresponds to a desired pulse output, thereby controlling the step-up chopper circuit via the drive circuit 23. The drive circuit 23 outputs a drive signal to the gate G of the switching element 22 based on the control signal from the control circuit unit 40 so as to perform the ON/OFF operation of the switching element 22.

The source S of the switching element 22 is connected to the load side of the DC reactor 21, and the drain D of the switching element 22 is grounded. When the switching element 22 is in an ON state, the load side of the DC reactor 21 is grounded, so that a DC reactor current iDCL flows from the terminal B to the terminal A through the switching element 22 in the ON state and the DC reactor 21. At this time, electromagnetic energy is accumulated in the DC reactor 21. Then, when the switching element 22 turns from the ON state to an OFF state, the energy accumulated in the DC reactor 21 generates a DC reactor voltage VDCL in the DC reactor 21. The step-up chopper circuit repeats the ON and OFF operations of the switching element 22 to boost an output voltage Vo according to the duty ratio of the ON/OFF times.

The control circuit unit 40 comprises an ignition mode control unit 42 for igniting the plasma in the ignition mode, a DC mode control unit 43 for holding a given discharge voltage state in the DC mode after the ignition of the plasma, a pulse mode control unit 44 for creating a pulse output by the duty control in the pulse mode, and a mode changing unit 41 for changing each mode.

The pulse mode control unit 44 changes the pulse width during which the duty value is changed to close the switching element 22 to bring the element into the ON state. In the initial stage, the start duty value is firstly used to perform the pulsing operation by one cycle, and then the transition duty value is used to gradually increase the duty in a plurality of cycles. After increasing the duty in the initial stage, each cycle in the subsequent pulse mode performs the pulsing operation with the steady duty to create the pulse output.

The pulse mode control unit 44 comprises a duty control unit 44c that makes the pulse width variable, and gradually increases the pulse width for closing the switching element in the initial stage of the pulsing operation to bring the switching element into the ON state, thereby lengthening a time for flowing a large DC reactor current through the DC reactor. By gradually increasing the pulse width, the increase in the difference between the voltage-time product in the ON state of the switching element and the voltage-time product in the OFF stage of the switching element is prevented, so that the occurrence of the magnetic saturation in the initial stage is inhibited. In the steady stage of the pulsing operation, the switching element is closed with the pulse width of the steady duty of the pulse mode so as to supply the steady power to the load. In the steady stage, since the capacitor voltage is sufficient for resetting the magnetic saturation of the DC reactor, the DC reactor does not reach the magnetic saturation in the pulse mode where the duty is change to that in the steady stage even when the voltage is clamped to the capacitor voltage.

The duty control unit 44c comprises a start duty unit 44c1, a transition duty unit 44c2 and a steady duty unit 44c3. The start duty unit 44c1 has the start duty value (DutyA), the transition duty unit 44c2 has the transition duty value (DutyB), and the steady duty unit 44c3 has the steady duty value (DutyPU). Furthermore, the pulse mode control unit 44 comprises, in addition to the duty control unit 44c, a cycle detecting unit 44a for detecting one cycle, and a voltage evaluating unit 44b for evaluating a charging status of the capacitor by using the capacitor voltage VC or the voltage change ΔVC of the capacitor voltage. The capacitor voltage VC is detected by a voltage detecting unit 60.

The mode changing unit 41 receives a start signal from an outside source and sends a signal for starting ignition to the ignition mode control unit 42. The ignition mode control unit 42 performs an ignition operation upon receipt of the start signal.

The mode changing unit 41 monitors the output voltage Vo, and on the basis of the output voltage Vo, sends to the DC mode control unit 43 a change signal for changing from the ignition mode to the DC mode. The DC mode control unit 43 applies a certain level of the DC voltage to induce the discharge voltage state.

After the DC node, the mode changing unit 41 sends to the pulse node control unit 44 a change signal for changing the node to the pulse mode.

In the pulse mode control unit 44, the duty control unit 44c uses the start duty value (DutyA) of the start duty unit 44c1 to start the control of the pulse mode. The drive circuit 23 performs the ON/OFF operation in one cycle with the pulse width at the start duty value (DutyA).

UPON receipt of the change signal for the pulse mode, the cycle detecting unit 44a detects each cycle of the pulsing operation. The cycle detecting unit 44a instructs the voltage evaluating unit 44b to evaluate the charge status of the capacitor every time the unit 44a detects the cycle of the pulsing operation. The voltage evaluating unit 44b evaluates for every cycle of the pulsing operation whether or not the capacitor voltage Vc detected by the voltage detecting unit 60 reaches the set voltage or whether or not the voltage change ΔVC as a difference between the capacitor voltage VC and the capacitor voltage Vc in the previous cycle is greater than the set value.

When the capacitor voltage VC does not reach the set voltage or when the voltage change ΔVC exceeds the set value, the duty control unit 44c uses the transition duty value (DutyB) of the transition duty unit 44c2 to control the drive circuit 23. The transition duty unit 44c2 gradually increases and updates the transition duty value (DutyB) cycle by cycle.

The transition duty unit 44c2 adds a value ΔDuty to the transition duty value (DutyB) in the previous cycle to update the transition duty value (DutyB). For the first transition duty value (DutyB), the start duty value (DutyA) is used as previous transition duty value.

When the capacitor voltage Vc reaches the set voltage or when the voltage change ΔVC does not exceed the set value, the duty value is changed from the transition duty value (DutyB) into the steady duty value (DutyPD) of the pulse mode, so as to use the steady duty value (DutyPU) of the steady duty unit 44c3 to control the drive circuit 23.

Configuration Example of DC Pulse Power Supply Device

In the following, a description will be made about the configuration examples of the DC pulse power supply device. The pulsing unit of the DC pulse power supply device according to the configuration examples comprises the regeneration unit for regenerating the reactor voltage in the DC reactor. The regeneration unit has the capacitor connected in parallel to the DC reactor as a configuration for regenerating the reactor voltage in the DC reactor.

A first configuration example is for regenerating a DC reactor voltage across the DC reactor of the step-up chopper circuit, and a second to fifth configuration examples are for regenerating the DC reactor voltage in one of two magnetically coupled DC reactors of the step-up chopper circuit. The magnetically coupled two DC reactors of the second and fifth configuration examples are tapped autotransformers, and the magnetically coupled two DC reactors of the third and fourth configuration examples are multi-winding transformers. As to the voltage of the reactor to be regenerated, the first to fifth configuration examples use a voltage on a low voltage side of the DC power supply as a reference voltage.

First Configuration Example of DC Pulse Power Supply Device

The first configuration example of the DC pulse power supply device of the present invention will be described by referring to FIG. 5.

The DC pulse power supply device of the invention comprises the DC power supply unit (DC unit) 10, a pulsing unit 20A that supplies to the load 5 with a pulse output generated by the step-up chopper circuit connected to the DC power supply unit 10, the regeneration unit 30 that regenerates an excessively-risen component of a voltage in the pulsing unit 20A to the DC power supply unit 10, the control circuit unit 40 that controls the DC power supply unit 10, the pulsing unit 20A, the drive circuit 23 and the regeneration unit 30, and the voltage detecting unit 60 that detects a capacitor voltage, the pulse output being supplied to the load 5 via an output cable 3. Although FIG. 5 shows an example of using the plasma generation device as the load 5, the load 5 is not limited to the plasma generation device and may be applied to an exciting of a pulse laser, an electrical discharge machine or similar.

DC Power Supply Unit

The DC power supply unit (DC unit) 10 comprises a rectifier 11 that rectifies an AC voltage in an AC power supply 2 to a DC voltage, a snubber circuit 12 that absorbs and suppresses a high voltage spike transiently generated during rectification, a single-phase inverter circuit 13 that changes the DC voltage into an AC voltage, a single-phase transformer 14 that transforms the AC voltage in the single-phase inverter circuit 13 to a predetermined voltage value, a rectifier 15 that rectifies the AC voltage transformed by the single-phase transformer 14 to a DC voltage, and a capacitor (CF) 16 in which a both-end voltage is a DC voltage of the DC power supply unit. One end of the capacitor 16 is grounded, and a negative low-voltage is applied at the other end thereof. The configuration in FIG. 5 shows a capacitive load of the plasma generation device as an example of the load 5. In this configuration, as one end of the plasma generation device is grounded to supply the negative voltage, the DC power supply unit 10 is configured to generate a pulse output of the negative voltage.

The single-phase inverter circuit 13 performs a switching operation in response to a control signal sent from the control circuit unit 40, so as to change the DC voltage into an AC voltage with a predetermined frequency. Each circuit element of the rectifiers 11, 15, the snubber circuit 12, the single phase inverter circuit 13 and the single-phase transformer 14, which compose the DC power supply unit 10, may be any circuitry that is commonly known.

Pulsing Unit

The pulsing unit 20A generates a pulse waveform from the DC voltage by the step-up chopper circuit. The step-up chopper circuit comprises a DC reactor 21a connected in series between the DC power supply and the load, a switching element (Q1) 22 connected in parallel to the load, and the drive circuit 23 for controlling an ON/OFF operation of the switching element 22. The pulsing unit 20A is provided on its DC power supply side with a grounded terminal B and a terminal A of negative voltage as low-voltage side. The illustrated switching element 22 is an example of FET, in which a source s is connected to the low-voltage side and a drain D is connected to a grounded-voltage side, thereby inputting a drive signal from the drive circuit 23 to a gate G.

The control circuit unit 40 generates a signal for setting a time width or duty ratio between an ON time and an OFF time of the switching element 22 with respect to a target pulse output in order to activate the step-up chopper circuit, as well as generating a control signal based on a voltage and current at the output end of the DC power supply unit 10.

The drive circuit 23 outputs the drive signal based on the control signal from the control circuit unit 40 to the gate G of the switching element 22, thereby making the switching element 22 to perform the ON/OFF operation.

The source S of the switching element 22 is connected to the load side of the DC reactor 21a, and the drain D of the switching element 22 is grounded. When the switching element 22 is in the ON state, the load side of the DC reactor 21a is grounded, and thereby a current flows from the terminal B to terminal A through the switching element 22 in the ON state and the DC reactor 21a, while a DC reactor current flows through the DC reactor 21a. At this time, electromagnetic energy is accumulated in the DC reactor 21a by the DC reactor current. Then, when the switching element 22 is turned from the ON state to the OFF state, a reactor voltage VDCL is generated in the DC reactor 21a by the accumulated energy in the DC reactor 21a. By repeating the ON and OFF operations of the switching element 22, the step-up chopper circuit boosts an output voltage Vo according to the duty ratio of the ON and OFF times.

Regeneration Unit

The regeneration unit 30 regenerates to the DC power supply a component of the reactor voltage in the DC reactor of the step-up chopper circuit that exceeds the set voltage. The regeneration unit 30 comprises a diode 31, a capacitor (C1) 32, an inverter circuit 33, a transformer 34 and a rectifier 35. The regeneration unit 30 provides a function of a voltage clairping unit 30 clamp as well as the regeneration function.

One end of the capacitor (C1) 32 is connected to an end on the load side of the DC reactor 21a, and the other end is connected to another end on the DC power supply side of the DC reactor 21a via the diode 31, so that the reactor voltage generated in the DC reactor 21a is applied. A capacitor voltage VC1 of the capacitor (C1) 32 is defined on the basis of a DC voltage VAB of the DC power supply and a transformer ratio of the transformer, and when the transformer ratio of the transformer 34 is (n2:n1), the capacitor voltage VC1 is defined as a set voltage expressed by VC1=(n2/n1)×VAB. The diode 31 is connected in such a way that a direction from the pulsing unit 20A toward the capacitor (C1) 32 of the regeneration unit 30 is a forward direction, and when the reactor voltage VDCL of the DC reactor 21a exceeds the capacitor voltage VC1 of the capacitor (C1) 32, the regeneration unit 30 regenerates a component of the reactor voltage VDCL that exceeds the capacitor voltage VC1 of the capacitor (C1) 32. Thus, the regeneration unit 30 performs the regeneration operation by using the capacitor voltage VC1 of the capacitor (C1) 32 as a threshold value.

As to a method for defining the capacitor voltage VC1, there is a solution to vary the transformer ratio of the transformer 34 as well as controlling the output of the inverter circuit 33. Such solution can be, for example, PWM control or phase-shift control, but is not limited thereto and any solution that controls the output of the inverter circuit may be adopted.

Figure 5:
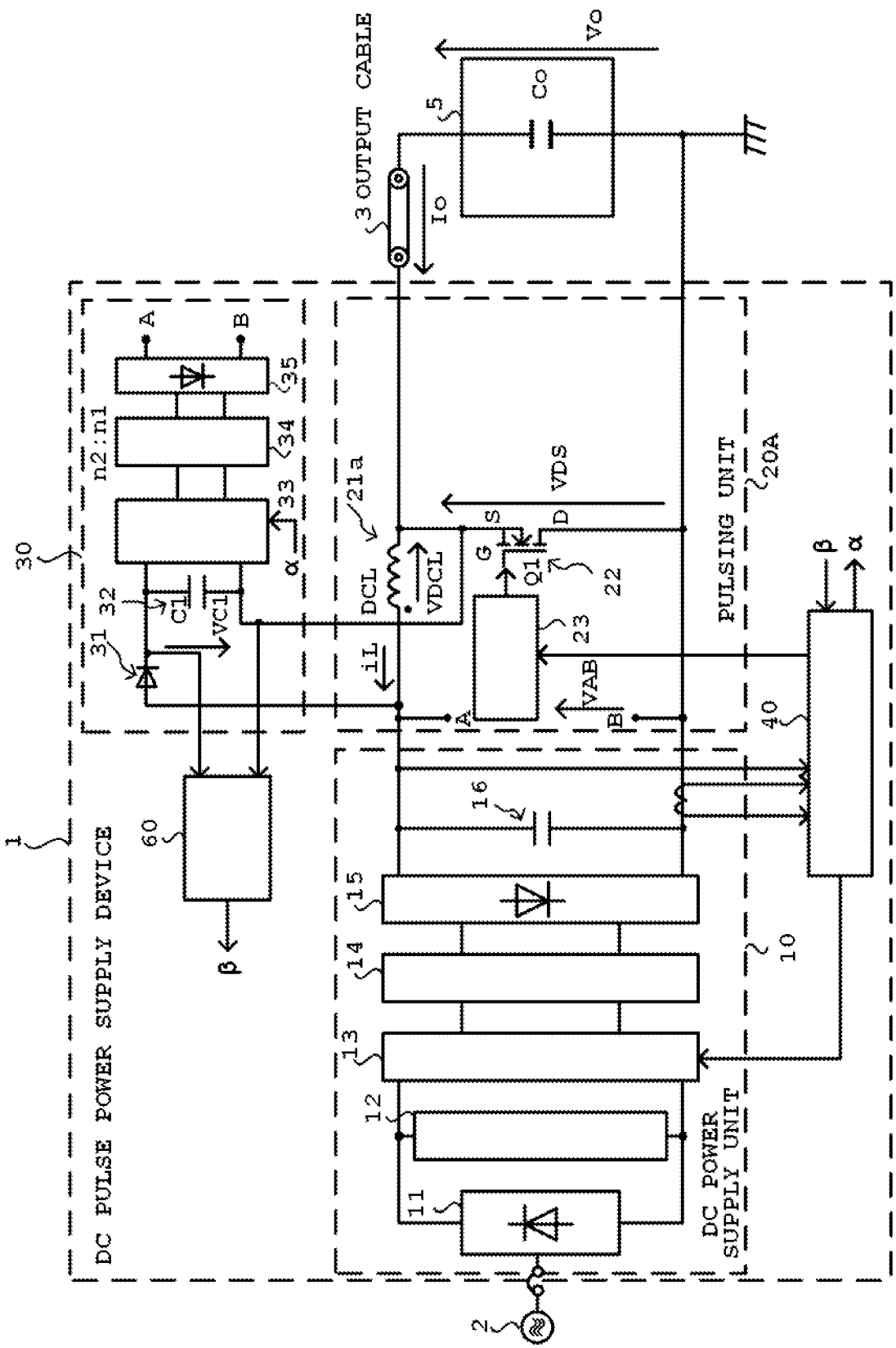
FIG. 5 illustrates a first configuration example of the DC pulse power supply of the invention.

Furthermore, in the circuitry shown in FIG. 5, the regeneration unit 30 is configured such that one end of the regeneration unit is connected to a low-voltage input end of the pulsing unit 20A, so as to regenerate the reactor voltage VDCL of the DC reactor 21a as a regeneration input voltage Vin based on a voltage on the low-voltage side (negative voltage).

The inverter circuit 33 performs orthogonal conversion between the DC voltage in the capacitor 32 and the AC voltage in the transformer 34 to thereby keep the capacitor voltage VC1 of the capacitor (C1) 32 to a constant voltage level based on the DC voltage VAB of the DC power supply, and when the reactor voltage VDCL exceeds the capacitor voltage VC1 of the capacitor (C1) 32, change the exceeded voltage component into an AC voltage to regenerate it to the DC power supply side. Since the capacitor voltage VC1 is maintained to the constant voltage level, the reactor voltage VDCL in the DC reactor 21a is clamped to the capacitor voltage VC1. In this way, the regeneration unit 30 provides the function of the voltage clamping unit 30 clamp. The inverter circuit 33 can be configured with a bridge circuit of the switching element, by way of example. The switching element is open and closed by the control in response to a control signal α from the control circuit unit 40.

The transformer 34 modulates a voltage ratio between the DC voltage VAB of the DC power supply unit 10 and the capacitor voltage VC1 of the capacitor (C1) 32 based on the transformer ratio. When the transformer ratio of the transformer 34 is (n2:n1), the relationship of the voltages between the DC voltage VAB and the capacitor voltage VC1 can be represented by VC1=(n2/n1)×VAB.

The rectifier 35 rectifies the AC voltage in the transformer 34 to the DC voltage in the DC power supply unit 10. The terminal on the DC side of the rectifier 35 is connected to the terminals A, B of the DC power supply unit 10, so that electric power is regenerated to the DC power supply unit 10 only when the capacitor voltage VC1 exceeds a voltage based on the DC voltage VAB.

The voltage detecting unit 60 detects a clamp voltage of a capacitor voltage VC1 in a DC reactor 21a, and in turn sends a detection signal β to the control circuit unit 40. The voltage evaluating unit 44b in the control circuit unit 40 evaluates the charging status of the capacitor based on the capacitor voltage VC according to the detection signal β.

The configuration of the regeneration unit 30 is not limited to the above-described one if the configuration includes a function of clamping the voltage across the DC reactor 21a to a predetermined voltage and a function of regenerating a component of electric power exceeding the predetermined voltage to the DC power supply.

Configuration Example of Regeneration Unit

Figure 6:
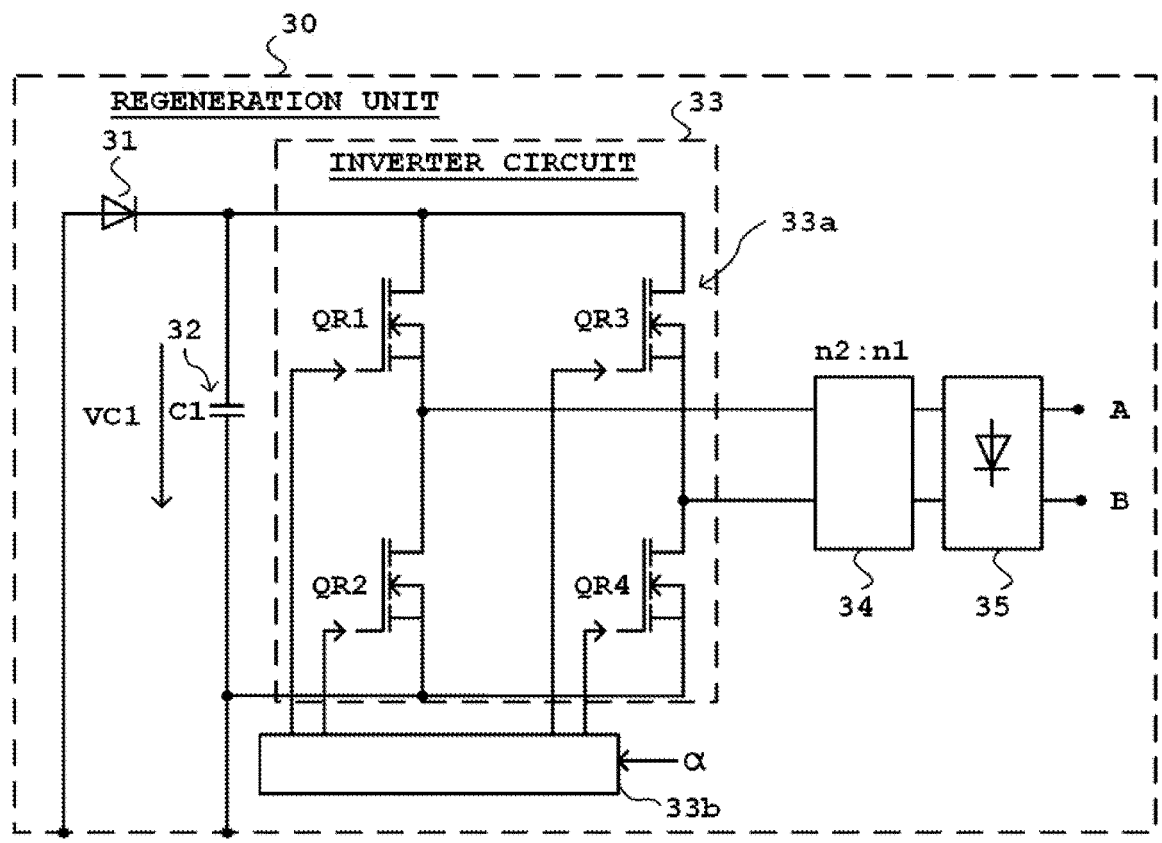
FIG. 6 illustrates a circuitry example of an inverter circuit included in a regeneration unit of the DC pulse power supply device of the invention.

Referring to FIG. 6, a description will be made about the circuitry of the inverter circuit included in the regeneration unit of the DC pulse power supply device.

The regeneration unit 30 includes the inverter circuit 33 that outputs to the transformer 34 an AC voltage obtained by performing orthogonal transformation on the DC voltage of the capacitor voltage VC1 in the capacitor (C1) 32. The inverter circuit 33 comprises a bridge circuit 33a consisting of switching elements QR1 to QR4, and a drive circuit 33b that generates a drive signals for driving the switching elements QR1 to QR4 based on a control signal α. In here, a full-bridge circuit is used as an example of the bridge circuit 33a, but the circuit 33a may be a half-bridge circuit or multi-phase inverter circuit.

Second Configuration of DC Pulse Power Supply Device

Figure 7:
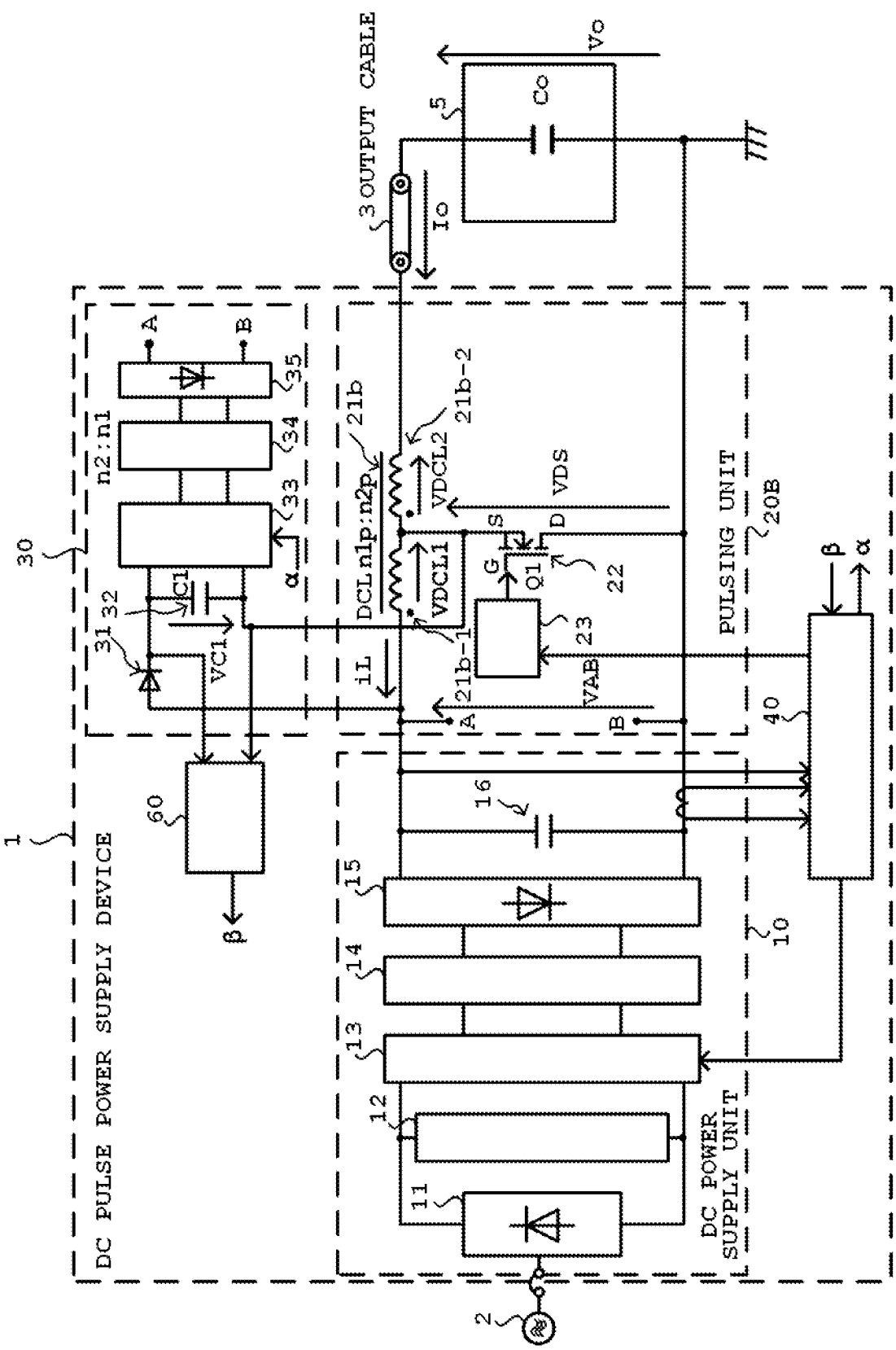
FIG. 7 illustrates a second configuration example of the DC pulse power supply of the invention.

A second configuration example of the DC pulse power supply device of the present invention will be described by referring to FIG. 7. The second configuration example is different from the first configuration example in the step-up chopper circuit in the pulsing unit 20, and is the same as the first configuration example in the other constituent elements. Next, a description will be made about the constituent element that differs from that of the first configuration example, and the description about the other common elements will be omitted.

The DC reactor 21a included in the step-up chopper circuit of the first configuration example is composed of a single coil. By contrast, the DC reactor 21b of the second configuration example is composed of a tapped autotransformer, instead of the single coil of the step-up chopper circuit of the first configuration example. The DC reactor 21b of the tapped autotransformer can be configured by connecting magnetically coupled first DC reactor 21b-1 and second DC reactor 21b-2 in series, and a connection point between the first DC reactor 21b-1 and the second DC reactor 21b-2 is used as a tapping point. One end of the first DC reactor 21b-1 is connected to the terminal A on the low-voltage side of the DC power supply, whereas one end of the second DC reactor 21b-2 is connected to the load side, and the tapping point of the connection point between the first DC reactor 21b-1 and the second DC reactor 21b-2 is connected to the source S of the switching element 22.

When the switching element 22 is in the ON state, the tapping point of the connection point of the DC reactor 21b is grounded, thereby flowing a DC reactor current from the terminal B to the terminal A through the switching element 22 in the OK state and the first DC reactor 21b-1 of the DC reactor 21b. At this time, electromagnetic energy is accumulated in the first DC reactor 21b-1 by the DC reactor.

Then, when the switching element 22 is turned from the ON state to the OFF state, the accumulated energy in the first DC reactor 21b-1 of the DC reactor 21b causes the generation of a reactor voltage VDCL1 in the first DC reactor 21b-1 and a reactor voltage VDCL2 in the second DC reactor 21b-2. By repeating the ON operation and the OFF operation of the switching element 22, the step-up chopper circuit boosts the output voltage Vo as with the case of the first configuration example.

The voltage ratio between the reactor voltage VDCL1 of the first DC reactor 21b-1 and the reactor voltage VDCL2 of the second DC reactor 21b-2 corresponds to an inductance ratio between the first DC reactor 21b-1 and the second DC reactor 21b-2. When a turns ratio of the tapped single-turning coils of the first DC reactor 21b-1 and second DC reactor 21b-2 of the DC reactor 21b is n1p:n2p, the voltage ratio (VDCL1/VDCL2) between the reactor voltage VDCL1 of the first DC reactor 21b-2 and the reactor voltage VDCL2 of the second DC reactor 21b-2 stands at the turns ratio of (n1p/n2p).

The regeneration unit 30 in the second configuration example performs in the same way as that of the first configuration example by applying the reactor voltage VDCL1 of the first CC reactor 21b-1 of the DC reactor 21b, instead of the reactor voltage VDCL of the DC reactor 21a in the first configuration example.

In the regeneration unit 30, one end of the capacitor (C1) 32 is connected to the connection point between the first DC reactor 21b-1 and second DC reactor 21b-2 of the DC reactor 21b, whereas the other end thereof is connected to the end on the DC power supply side of the first DC reactor 21b-1 via the diode 31, thereby applying the reactor voltage VDCL1 generated in the first DC reactor 21b-1. The capacitor voltage VC1 of the capacitor (C1) 32 is defined on the basis of the DC voltage VAB of the DC power supply and the transformer ratio of the transformer 34, and when the transformer ratio of the transformer 34 is (n2:n1), the capacitor voltage VC1 is defined as a set voltage expressed by VC1=(n2/n1)×VAB. The diode 31 is connected such that a direction from the pulsing unit 20B toward the capacitor (C1) 32 of the regeneration unit 30 is a forward direction, and when the reactor voltage VDCL1 in the first DC reactor 21b-1 exceeds the capacitor voltage VC1 in the capacitor (C1) 32, the regeneration unit 30 regenerates a component of the reactor voltage VDCL1 that exceeds the capacitor voltage VC1 of the capacitor (C1) 32. In this way, the regeneration unit 30 performs the regeneration operation by using the capacitor voltage VC1 in the capacitor (C1) 32 as a threshold value, as with the case of the first configuration example.

The regeneration unit 30 composes the voltage clamping unit as with the case of the first configuration example, in order to clamp a voltage across the first DC reactor 21b-1. In addition to that, the voltage detecting unit 60 detects a clamp voltage obtained by the capacitor voltage VC1 in the first DC reactor 21b-1, and in turn sends the detection signal β to the control circuit unit 40. The voltage evaluating unit 44b in the control circuit unit 40 evaluates the charging status of the capacitor based on the capacitor voltage VC according to the detection signal β.

As the output voltage Vo, output is a voltage (Vc=VAB+VDCL1+VDCL2) obtained by superimposing the reactor voltage VDCL1 of the first DC reactor 21b-1 and the reactor voltage VDCL2 of the second DC reactor 21b-2 on the DC voltage VAB of the DC power supply. Since the reactor voltage VDCL1 of the first DC reactor 21b-1 is clamped to the capacitor voltage VC1, the output voltage Vo stands at Vo=VAB+VC1+VDCL2.

Third Configuration of DC Pulse Power Supply Device

Figure 8:
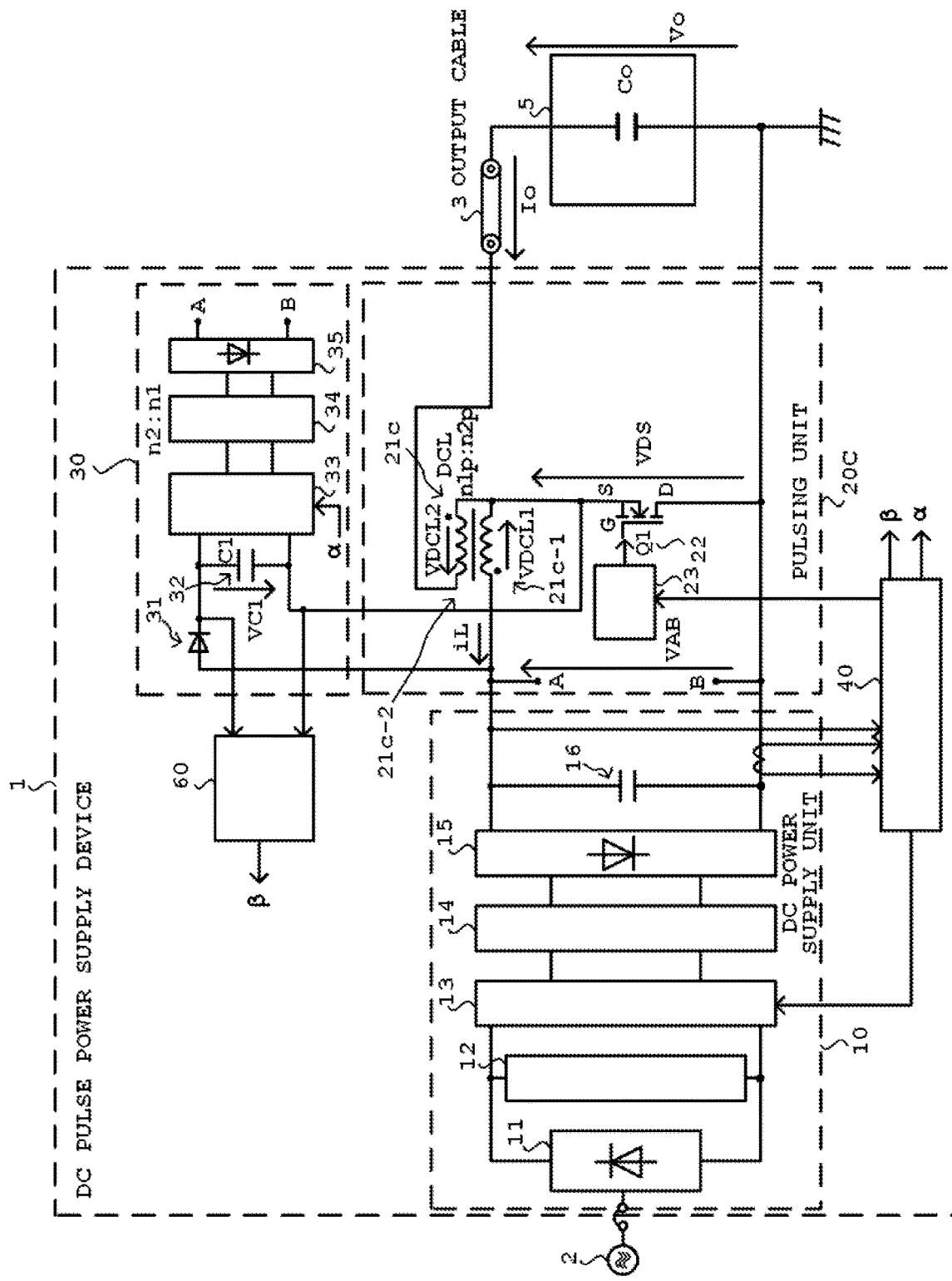
FIG. 8 illustrates a third configuration example of the DC pulse power supply of the invention.

A description will now be made about a third configuration example of the DC pulse power supply device of the invention by referring to FIG. 8. The third configuration example is different from the first and second configuration examples in a step-up chopper circuit in a pulsing unit 20C, and is the same as the first and second configuration examples in the other constituent elements. Next, a description will be made about the constituent element that differs from those of the first and second configuration examples, and the description about the other common elements will be omitted.

The DC reactor 21b included in the step-up chopper circuit of the second configuration example is composed of a tapped autotransformer. By contrast, a DC reactor 21c of the third configuration example is composed of a multi-winding transformer, instead of the tapped autotransformer of the step-up chopper circuit of the second configuration example. The multi-winding transformer of the DC reactor 21c is an example of an additive polarity transformer.

The DC reactor 21c of the multi-winding transformer is configured by connecting magnetically coupled first DC reactor 21c-1 and second DC reactor 21c-2 in parallel. One end of the first DC reactor 21c-1 is connected to the terminal A on the low-voltage side of the DC power supply, and the other end thereof is connected to the end of the source S of the switching element 22. One end of the second DC reactor 21c-2 is connected to the end of the source S of the switching element 22, and the other end is connected to the load side.

When the switching element 22 is in the ON state, the end on the switching element 22 side of the first DC reactor 21c-1 of the DC reactor 21c is grounded, so that a DC reactor current flows from the terminal B to the terminal A through the switching element 22 in the ON state and the first DC reactor 21c. At this time, electromagnetic energy is accumulated in the first DC reactor 21c by the DC reactor.

Then, when the switching element 22 is turned from the ON state to the OFF state, the energy accumulated in the first DC reactor 21c-1 of the DC reactor 21c causes the generation of the reactor voltage VDCL1 in the first DC reactor 21c-1, and the electromagnetic coupling of the second DC reactor 21c-2 with the first DC reactor 21c-1 causes the generation of the reactor voltage VDCL2 in the second DC reactor 21c-2. By repeating the ON operation and the OFF operation of the switching element 22, the step-up chopper circuit can boost the output voltage Vo as with the case of the first and second configuration examples.

A voltage ratio between the reactor voltage VDCL1 of the first DC reactor 21c-1 and the reactor voltage VDCL2 of the second DC reactor 21c-2 stands at a value corresponding to an inductance ratio between the first DC reactor 21c-1 and the second DC reactor 21c-2. When a turns ratio of the multi-turning coils of the first DC reactor 21c-1 and second DC reactor 21c-2 of the DC reactor 21c is (n1p:n2p), the voltage ratio (VDCL1/VDCL2) between the reactor voltage VDCL1 of the first DC reactor 21c-1 and the reactor voltage VDCL2 of the second DC reactor 21c-2 stands at the turns ratio of (n1p/n2p).

The regeneration unit of the third configuration example performs in the way similar to the case in the regeneration unit for the reactor voltage VDCL1 of the first DC reactor 21b-1 of the DC reactor 21b of the second configuration example.

In the regeneration unit 30, one end of the capacitor (C1) 32 is connected to an end on the switching element side of the first DC reactor 21c-1 of the DC reactor 21c and the other end is connected to another end on the DC power supply side of the first DC reactor 21c-1 via the diode 31, so as to apply the reactor voltage VDCL1 generated in the first DC reactor 21c-1. The capacitor voltage VC1 in the capacitor (C1) 32 is defined on the basis of the DC voltage VAB of the DC power supply and the transformer ratio of the transformer, and when the transformer ratio of the transformer 34 is (n2:n1), the capacitor voltage VC1 defined as a set voltage expressed by VC1=(n2/n1)×VAB. The diode 31 is connected such that a direction from the pulsing unit toward the capacitor (C1) 32 of the regeneration unit 30 is a forward direction, and when the DC reactor voltage VDCL1 of the first DC reactor 21c-1 exceeds the capacitor voltage VC1 of the capacitor (C1) 32, the regeneration unit 30 regenerates a component of the reactor voltage VDCL1 that exceeds the capacitor voltage VC1 of the capacitor (C1) 32. In this way, the regeneration unit 30 performs the regeneration operation by using the capacitor voltage VC1 of the capacitor (C1) 32 as a threshold value, as with the cases of the first and second configuration examples.

The regeneration unit 30 composes the voltage clamping unit as with the case of the first configuration example, in order to clamp a voltage across the DC reactor 21c-1. In addition to that, the voltage detecting unit 60 detects the clamp voltage obtained by the capacitor voltage VC1 of the DC reactor 21c-1 to thereby send the detection signal β to the control circuit unit 40. The voltage evaluating unit 44b in the control circuit unit 40 evaluates the charging status of the capacitor based on the capacitor voltage VC according to the detection signal β.

As the output voltage Vo, output is a voltage (Vo=VAB+ VDCL1+VDCL2) obtained by superimposing the reactor voltage VDCL1 of the first DC reactor 21c-1 and the reactor voltage VDCL2 of the second DC reactor 21c-2 on the DC voltage VAB of the DC power supply. Since the reactor voltage VDCL1 of the first DC reactor 21c-1 is clamped to the capacitor voltage VC1, the output voltage Vo is Vo=VAB+VC1+VDCL2. When a turns ratio of the first DC reactor 21c-1 and the second DC reactor 21c-2 is (n1p/n2p), the reactor voltage VDCL1 and the reactor voltage VDCL2 are represented by (VDCL1/VDCL2=n1p/n2p).

Fourth Configuration of DC Pulse Power Supply Device

Figure 9:
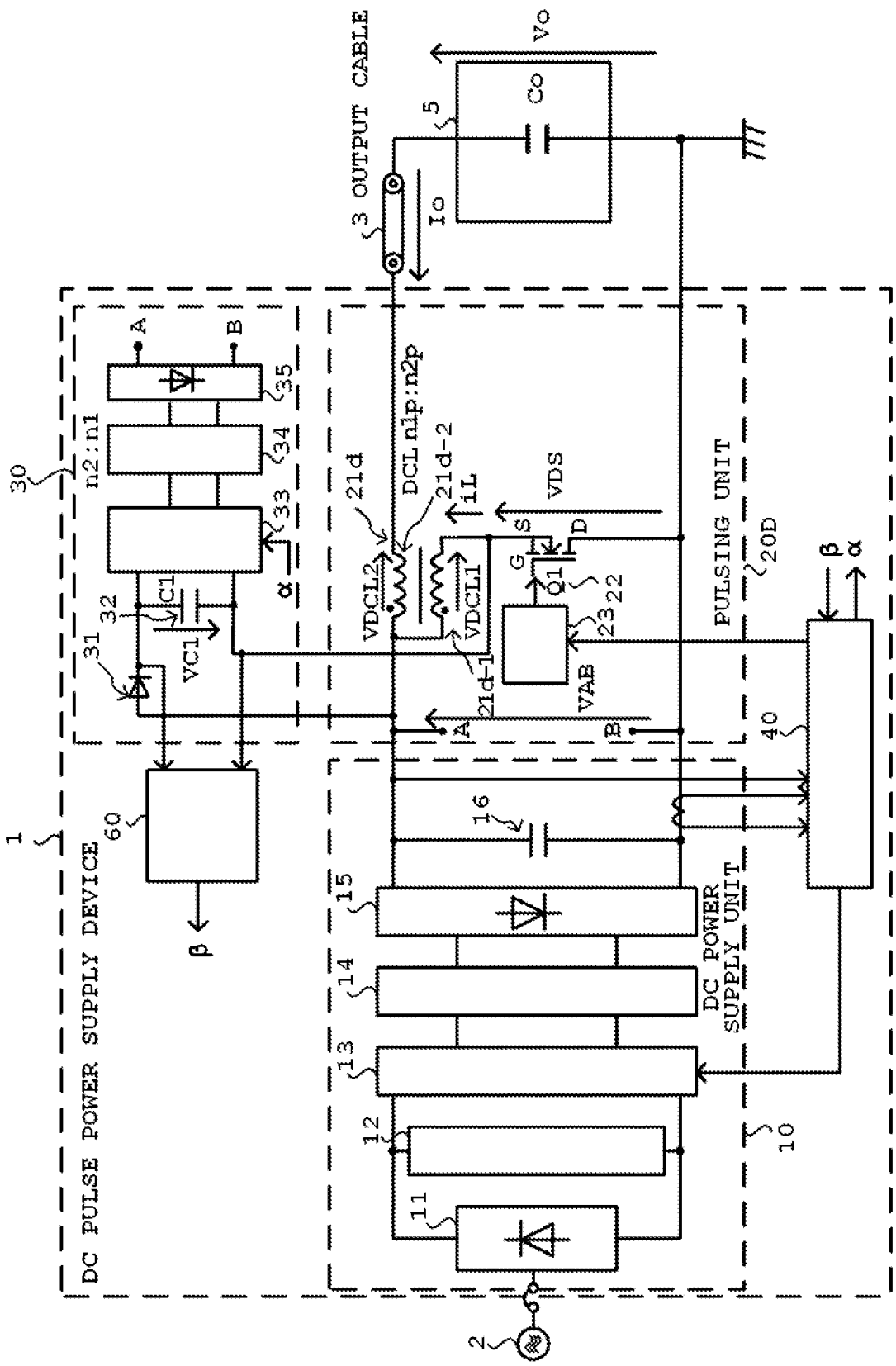
FIG. 9 illustrates a fourth configuration example of the DC pulse power supply of the invention.

A description will now be made about a fourth configuration example of the DC pulse power supply device of the invention by referring to FIG. 9. The fourth configuration example is different from the third configuration example in the transformer that constitutes a step-up chopper circuit in a pulsing unit 20D, and is the same as the third configuration example in the other constituent elements.

The DC reactor 21c included in the step-up chopper circuit of the third configuration example is composed of the multi-winding transformer with the additive polarity. By contrast, the DC reactor 21d of the fourth configuration example is composed of a multi-winding transformer with a subtractive polarity, instead of the multi-winding transformer with the additive polarity of the step-up chopper circuit of the third configuration example.

The DC reactor 21d of the multi-winding transformer is configured by connecting magnetically coupled first DC reactor 21d-1 and second DC reactor 21d-2 in parallel. One end of the first DC reactor 21d-1 is connected to the terminal A on the low-voltage side of the DC power supply, and the other end thereof is connected to the source S of the switching element 22. One end of the second DC react 21d-2 is connected to the terminal A on the low-voltage side of the DC power supply, and the other end is connected to the load side.

When the switching element 22 is in the ON state, the end on the switching element 22 side of the first DC reactor 21d-1 of the DC reactor 21d is grounded, so that a DC reactor current flows from the terminal B to the terminal A through the switching element 22 in the ON state and the first DC reactor 21d-1. At this time, electromagnetic energy is accumulated in the first DC reactor 21d-1 by the DC reactor.

Then, when the switching element 22 is turned from the ON state to the OFF state, the accumulated energy in the first DC reactor 21d-1 of the DC reactor 21d causes the generation of the reactor voltage VDCL1 in the first DC reactor 21d-1, and the electromagnetic coupling of the second DC reactor 21d-2 with the first DC reactor 21d-1 causes the generation of the reactor voltage VDCL2 in the second DC reactor 21d-2. By repeating the ON operation and the OFF operation of the switching element 22, the step-up chopper circuit boosts the output voltage Vo as with the cases of the first, second and third configuration examples.

A voltage ratio between the reactor voltage VDCL1 of the first DC reactor 21d-1 and the reactor voltage VDCL2 of the second DC reactor 21d-2 stands at a value corresponding to an inductance ratio between the first DC reactor 21d-1 and the second DC reactor 21d-2. When a turns ratio of the multi-turning coils of the first DC reactor 21d-1 and second DC reactor 21d-2 of the DC reactor 21d is (n1p:n2p), the voltage ratio (VDCL1/VDCL2) between the reactor voltage VDCL1 of the first DC reactor 21d-1 and the reactor voltage VDCL2 of the second DC reactor 21d-2 stands at the turns ratio of (n1p/n2p).

The DC reactor 21d of the regeneration unit of the fourth configuration example performs in the way similar to the case of the DC reactor 21c for the reactor voltage VDCL1 of the first DC reactor 21c of the third configuration example.

In the regeneration unit 30, one end of the capacitor (C1) 32 is connected to an end on the switching element side of the first DC reactor 21d-1 of the DC reactor 21d and the other end is connected to an end on the DC power supply side of the first DC reactor 21d-1 via the diode 31, so as to apply the reactor voltage VDCL1 generated in the first DC reactor 21d-1. The capacitor voltage VC1 in the capacitor (C1) 32 is defined on the basis of the DC voltage VAB of the DC power supply and the transformer ratio of the transformer, and when the transformer ratio of the transformer 34 is (n2:n1), the capacitor voltage VC1 is defined as a set voltage represented by VC1=(n2/n1)×VAB. The diode 31 is connected such that a direction from the pulsing unit toward the capacitor (C1) 32 of the regeneration unit 30 is a forward direction, and when the reactor voltage VDCL1 of the first DC reactor 21d-1 exceeds the capacitor voltage VC1 of the capacitor (C1) 32, the regeneration unit 30 regenerates a component of the reactor voltage VDCL1 that exceeds the capacitor voltage VC1 of the capacitor (C1) 32. In this way, the regeneration unit 30 performs the regeneration operation by using the capacitor voltage VC1 of the capacitor (C1) 32 as a threshold value, as with the cases of the first, second and third configuration examples.

The regeneration unit 30 composes the voltage clamping unit as with the case of the first configuration example, in order to clamp a voltage across the DC reactor 21d-1. In addition to that, the voltage detecting unit 60 detects the clamp voltage obtained by the capacitor voltage VC1 of the DC reactor 21d-1 to thereby send the detection signal β to the control circuit unit 40. The voltage evaluating unit 44b in the control circuit unit 40 evaluates the charging status of the capacitor based on the capacitor voltage VC according to the detection signal β.

As the output voltage Vo, output is a voltage (Vo=VAB+ VDCL2) obtained by superimposing the reactor voltage VDCL2 of the second DC reactor 21*d*-2 on the DC voltage VAB of the DC power supply. When a turns ratio of the first DC reactor 21*d*-1 and the second DC reactor 21*d*-2 is (n1p/n2p), the reactor voltages VDCL1 and VDCL2 are represented by (VDCL1/VDCL2=n1p/n2p). Thus, when the voltage VDCL1 is clamped to the voltage VC1, the output voltage Vo stands at Vo=VAB+VC1×(n1p/n2p).

Fifth Configuration of DC Pulse Power Supply Device

Figure 10:
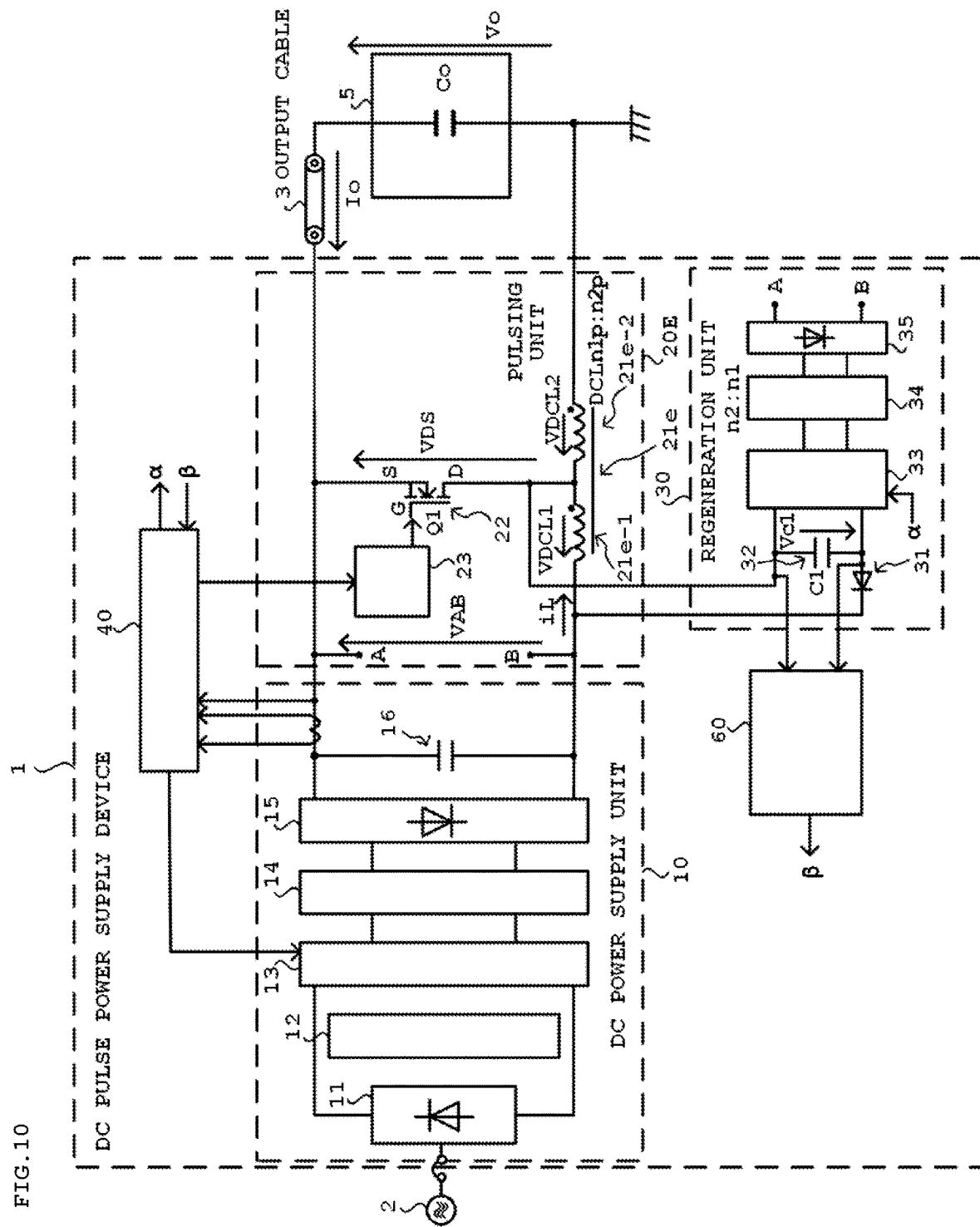
FIG. 10 illustrates a fifth configuration example of the DC pulse power supply of the invention.
Figure 11:
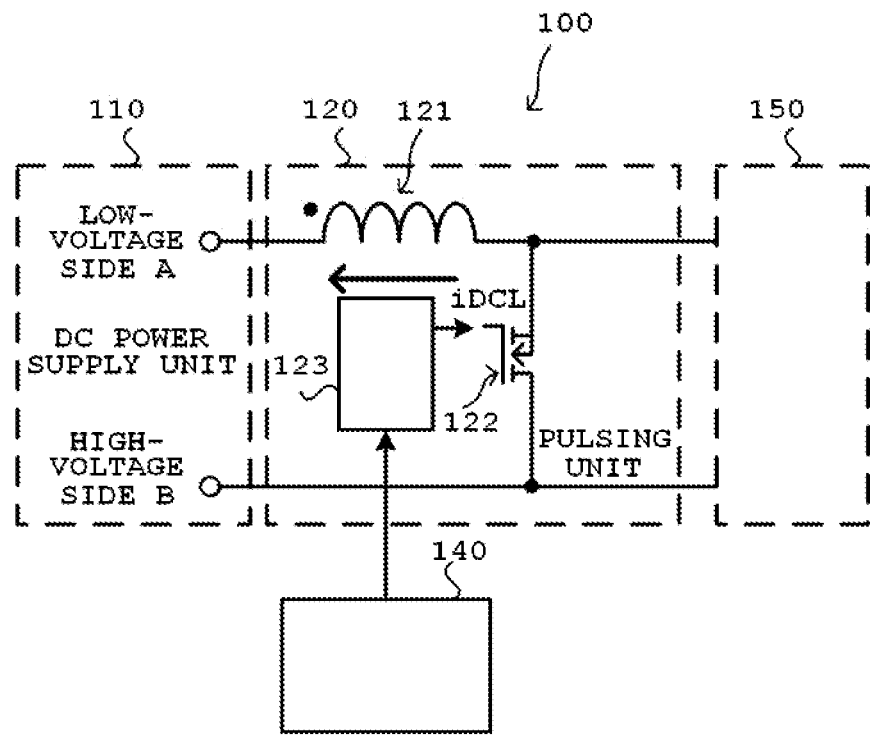
FIG. 11 illustrates a configuration example of a conventional DC pulse power supply device.
Figure 12:
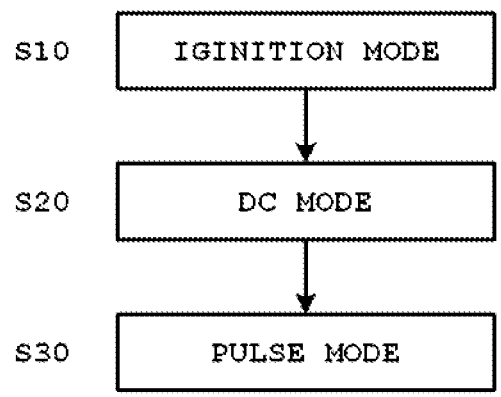
FIG. 12 is a schematic flowchart illustrating each mode for supplying a pulse output from the DC pulse power supply device to a plasma load.
Figure 13A:
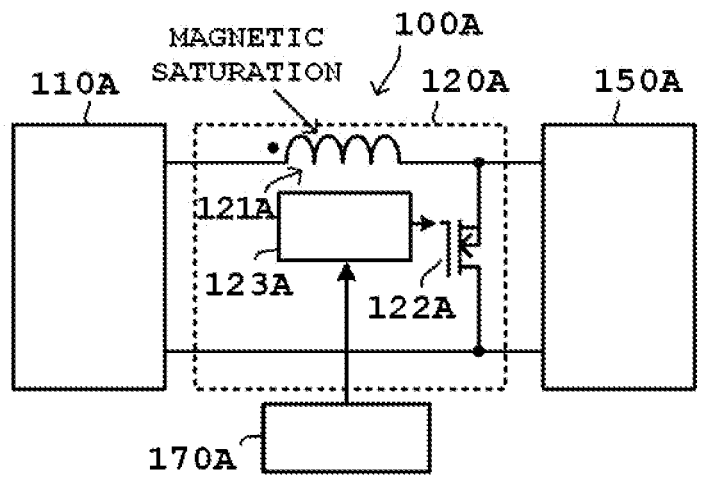
FIGS. 13(a) to 13(c) illustrate magnetic saturation of a DC reactor.
Figure 13B:
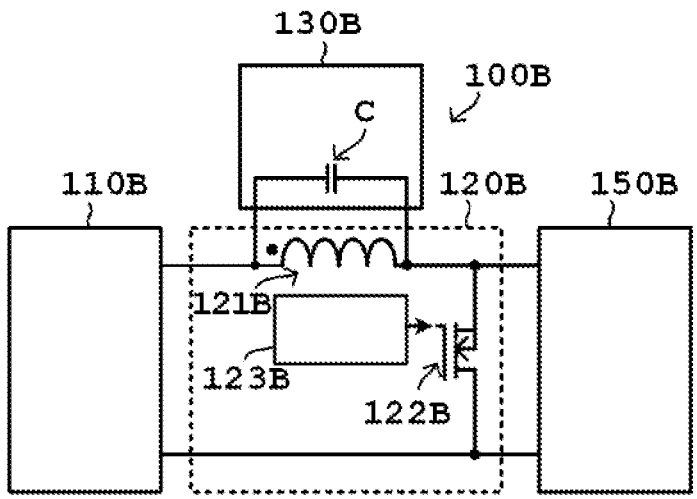
Figure 13C:
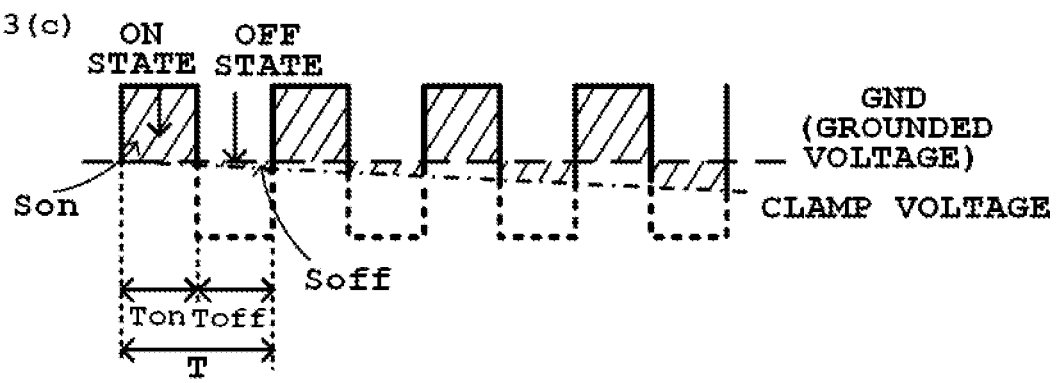

A description will be made about a fifth configuration example of the DC Pulse power supply device of the present invention by referring to FIG. 10. The fifth configuration example is different from the second configuration example in the arrangement of the DC reactor of the step-up chopper circuit, and is the same as the second configuration example in the other constituent elements. In the following, the difference from the second configuration example will be described, and the description about the other common elements will be omitted.

A DC reactor 21*e* included in the step-up chopper circuit of the fifth configuration example is composed of a trapped autotransformer, as with the DC reactor 21*b* of the step-up chopper circuit of the second configuration example, but is different in its arrangement with respect to a power line. The DC reactor 21*b* of the second configuration example is connected to a power line on the low-voltage side of the DC power supply, whereas the DC reactor 21*e* of the fifth configuration example is connected to a power line on the high-voltage side of the DC power supply.

The DC reactor 21*e* of the tapped autotransformer is configured by connecting magnetically coupled first DC reactor 21*e*-1 and second DC reactor 21*e*-2 in series, and uses a connection point between the first DC reactor 21*e*-1 and the second DC reactor 22*e*-2 as tapping point. One end of the first DC reactor 21*e*-1 is connected to the terminal B on the high-voltage side of the DC power supply, and one end of the second DC reactor 21*e*-2 is connected to the load side and further grounded. The tapping point of the connection point of the first DC reactor 21*e*-1 and the second DC reactor 21*e*-2 is connected to the end of the drain D of the switching element 22.

When the switching element 22 is in the ON state, the tapping point of the connection point of the DC reactor 21*e* is grounded via the second DC reactor 21*e*-2, so that a DC reactor current can flow from the terminal B to the terminal A through the first DC reactor 21*e*-1 and the switching element 22 in the ON state. At this time, electromagnetic energy in the first DC reactor 21*e*-1 is accumulated by the DC reactor.

Then, when the switching element 22 is turned from the ON state to the OFF state, the accumulated energy in the first DC reactor 21*e*-1 of the DC reactor 2*e* causes the generation of the reactor voltage VDCL1 in the first DC reactor 21*e*-1, while causing the generation of the reactor voltage VDCL2 in the second DC reactor 21*e*-2. By repeating the ON operation and the OFF operation of the switching element 22, the step-up chopper circuit can boost the output voltage Vo as with the case of the first configuration example.

A voltage ratio between the reactor voltage VDCL1 of the first DC reactor 21*e*-1 and the reactor voltage VDCL2 of the second DC reactor 21*e*-2 stands at a value corresponding to an inductance ratio between the first DC reactor 21*e*-1 and the second DC reactor 21*e*-2. When a turns ratio of a tapped single-winding coils of the first DC reactor 21*e*-1 and the second DC reactor 21*e*-2 of the DC reactor 21 is n1p:n2p, the voltage ratio (VDCL1/VDCL2) between the reactor voltage VDCL1 of the first DC reactor 21*e*-1 and the reactor voltage VDCL2 of the second DC reactor 21*e*-2 stands at the turns ratio of (n1p/n2p).

The regeneration unit 30 of the fifth configuration example can perform in the manner similar to the case in the first configuration example by employing the reactor voltage VDCL1 of the first DC reactor 21*e*-1 of the DC reactor 21*e* instead of the reactor voltage VDCL of the DC reactor 21*a* of the first configuration example.

In the regeneration unit 30, one end of the capacitor (C1) 32 is connected to the connection point between the first DC reactor 21*e*-1 and second DC reactor 21*e*-2 of the DC reactor 21*e* and the other end is connected to the end on the DC power supply side of the first DC reactor 21*e*-1 via the diode 31, thereby applying the reactor voltage VDCL1 generated in the first DC reactor 21*e*-1. The capacitor voltage VC1 of the capacitor (C1) 32 is defined based on the DC voltage VAB of the DC power supply and the transformer ratio of the transformer, and when the transformer ratio of the transformer 34 is (n2:n1), the capacitor voltage VC1 is defined as a set voltage expressed by VC1=(n2/n1)×VAB. The diode 31 is connected such that a direction from the pulsing unit 20D toward the capacitor (C1) 32 of the regeneration unit 30 is a reversed direction, and when the reactor voltage VDCL1 of the first DC reactor 21*e*-1 exceeds the capacitor voltage VC1 of the capacitor (C1) 32, the regeneration unit 30 regenerates a component of the reactor voltage VDCL1 that exceeds the capacitor voltage VC1 of the capacitor (C1) 32. Thus, the regeneration unit 30 performs the regeneration operation by using the capacitor voltage VC1 of the capacitor (C1) 32 as a threshold value, as with the case of the first configuration example.

The regeneration unit 30 composes the voltage clamping unit as with the case of the first configuration example in order to clamp a voltage across the DC reactor 21*e*-1. Furthermore, the voltage detecting unit 60 detects the clamp voltage obtained by the capacitor voltage VC1 of the DC reactor 21*e*-1 to thereby send the detection signal β to the control circuit unit 40. The voltage evaluating unit 44*b* in the control circuit unit 40 evaluates the charging status of the capacitor based on the capacitor voltage VC according to the detection signal β.

As the output voltage Vo, output is a voltage (Vc=VAB+VDCL1+VDCL2) obtained by superimposing the reactor voltage VDCL1 of the first DC reactor 21*e*-1 and the reactor voltage VDCL2 of the second DC reactor 21*e*-2 on the DC voltage VAB of the DC power supply. Since the reactor voltage VDCL1 of the first DC reactor 21*e*-1 is clamped to the capacitor voltage VC1, the output voltage Vo stands at Vo=VAB+VC1+VDCL2.

In the DC pulse power supply device according to the first configuration example to the fifth configuration example, the control circuit unit 40 comprises the pulse mode control unit that controls the pulsing operation in the pulse mode for generating the pulse output in a certain cycle, the pulse mode control unit comprising the duty control unit that makes the pulse width variable. The duty control unit closes the switching element in the initial stage of the pulsing operation to gradually increase the pulse width of the DC reactor current flowing through the DC reactor, so as to prevent the increase in the difference between the voltage-time product in the ON state of the switching element and the voltage-time product in the OFF state of the switching element and thus prevent the occurrence of the magnetic saturation in the initial stage of the pulse mode.

Furthermore, the voltage at the S terminal of the switching element is clamped to a voltage lower than the surge voltage to prevent the excessive rise in the voltage applied to the switching element, and the duty control performed by the pulse mode control unit resets the magnetic saturation of the DC reactors 21a to 21e.

The description about the above embodiments and modifications are examples of the DC pulse power supply device in accordance with the present invention. The present invention is therefore not limited to the above embodiments and can be changed or modified in various ways on the basis of the ideas of the invention, and these variations are not excluded from the scope of the invention.

INDUSTRIAL APPLICABILITY

The DC pulse power supply device of the present invention can be applied as power supply for supplying electric power to a plasma generation device, and furthermore can be used as power supply device for supplying a pulse output to, for instance, a load for exciting a pulse laser, or of an electric discharge machine.

REFERENCE SIGNS LIST

1 DC Pulse Power Supply Device
2 AC Power Supply
3 Output Cable
5 Load
10 DC Power Supply Unit
11 Rectifier
12 Snubber Circuit
13 Single-Phase Inverter Circuit
14 Single-Phase Transformer
15 Rectifier
16 Capacitor
20 Pulsing Unit
20A-20D Pulsing Unit
21, 21a-21e DC Reactor
22 Switching Element
23 Drive Circuit.
30 Regeneration Unit
30 clamp Voltage Clamping Unit
31 Diode
32 Capacitor
33 Inverter Circuit
33a Bridge circuit
33b Drive Circuit
34 Transformer
35 Rectifier
40 Control Circuit Unit
41 Mode Changing Unit
42 Ignition Mode Control Unit
43 DC Mode Control Unit
44 Pulse Mode Control Unit
44a cycle Detecting Unit
44b Voltage Evaluating Unit
44c Duty Control Unit
44c1 Start Duty Unit
44c2 Transition Duty Unit
44c3 Steady Duty Unit
44c Duty Control Unit
50 Load
60 Voltage Detecting Unit
100 DC Pulse Power Supply Device
110 DC Power Supply Unit
120 Pulsing Unit
121 DC Reactor
122 Switching Element
123 Drive circuit
140 Control Circuit Unit
150 Load
QR1-QR4 Switching Element
iDCL DC Reactor Current
ΔVC Voltage Change
α Control Signal
β Detection Signal

The invention claimed is:

1. A DC pulse power supply device, comprising:
a DC power supply;
a pulsing unit that is connected to the DC power supply and generates a pulse output by a step-up chopper circuit comprising a series circuit composed of a DC reactor and a switching element;
a voltage clamping unit that comprises a capacitor connected in parallel to the DC reactor of the pulsing unit, and uses a capacitor voltage in the capacitor to limit a voltage across the DC reactor to a clamp voltage; and
a control circuit unit that controls a switching operation of the switching element of the pulsing unit, wherein
the control circuit unit comprises a pulse mode control unit that controls a pulsing operation of a pulse mode for generating the pulse output in a certain cycle,
the pulse mode control unit comprises a duty control unit that makes a pulse width variable,
the duty control unit closing the switching element in an initial stage of the pulsing operation to gradually increase the pulse width for passing a current through the DC reactor.

2. The DC pulse power supply device according to claim 1, wherein the duty control unit has in the initial stage of the pulsing operation:
an initial duty value at the start of the pulsing operation; and
a transition duty value for gradually increase the pulse width, and
the duty control unit further has in a steady stage of the pulsing operation subsequent to the initial stage:
a steady duty value for fixing the pulse width,
the duty value being changed from the transition duly value to a steady mode duty value on the basis of the capacitor voltage of the capacitor or a voltage change of the capacitor voltage.

3. The DC pulse power supply device according to claim 2, wherein the pulse mode control unit comprises a voltage evaluating unit that evaluates a charging status of the capacitor on a basis of a voltage level or the voltage change of the capacitor voltage, and
on a basis of a result of an evaluation based on the voltage level or voltage change of the capacitor voltage made by the voltage evaluating unit, the duty control unit changes the duty value from the transition duty value to the steady mode duty value.

4. The DC pulse power supply device according to claim 1, further comprising a regeneration unit that regenerates a component of a reactor voltage in the DC reactor that exceeds a set voltage to the DC power supply, wherein
the regeneration unit comprises the capacitor connected in parallel to the DC reactor, the capacitor using the reactor voltage in the DC reactor as regeneration input voltage.

5. A duty control method for a DC pulse power supply device that comprises:
a DC power supply;

a pulsing unit that is connected to the DC power supply and generates a pulse output by a step-up chopper circuit comprising a series circuit composed of a DC reactor and a switching element;

a pulsing unit that is connected to the DC power supply and generates a pulse output by a step-up chopper circuit comprising a series circuit composed of a DC reactor and a switching element;

a voltage clamping unit that comprises a capacitor connected in parallel to the DC reactor of the pulsing unit, and uses a capacitor voltage in the capacitor to limit a voltage across the DC reactor to a clamp voltage; and a control circuit unit that controls a switching operation of the switching element of the pulsing unit, wherein the control circuit unit performs duty control in pulse mode control, which controls a pulsing operation in a pulse mode for generating the pulse output in a certain cycle of the switching element, to thereby close the switching element to make a pulse width variable for passing a current through the DC reactor, in which the duty control is performed:

in an initial stage of the pulsing operation, to gradually increase the pulse width from its initial value at the start of the pulsing operation; and in a steady stage of the pulsing operation subsequent to the initial stage, to hold the pulse width to a predetermined fixed width.

6. The duty control method for the DC pulse power supply device according to claim 5, wherein the control circuit unit changes the stage from the initial stage to the steady stage due to charge of the capacitor voltage in the capacitor to a level of a specified voltage.

7. The duty control method for the DC pulse power supply device according to claim 6, wherein the specified voltage is a reset voltage for resetting magnetic saturation of the DC reactor.

8. The duty control method for the DC pulse power supply device according to claim 5, wherein the control circuit unit changes the stage from the initial stage to the steady stage when a voltage change of the capacitor voltage in the capacitor is within a predetermined fluctuation range.

* * * * *